United States Patent
Yao et al.

(10) Patent No.: US 6,580,532 B1
(45) Date of Patent: Jun. 17, 2003

(54) OPTO-ELECTRONIC TECHNIQUES FOR REDUCING PHASE NOISE IN A CARRIER SIGNAL BY CARRIER SUPRESSION

(75) Inventors: Steve Yao, Diamond Bar, CA (US); John Dick, Claremont, CA (US); Lute Maleki, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/493,642

(22) Filed: Jan. 28, 2000

Related U.S. Application Data
(60) Provisional application No. 60/117,883, filed on Jan. 28, 1999.

(51) Int. Cl.[7] .......................... H04K 3/00; H04B 10/04; H04J 14/02
(52) U.S. Cl. .................. 359/111; 359/180; 359/183; 359/187; 359/127; 372/29.011; 372/29.02; 372/29.03
(58) Field of Search ................. 359/111, 180, 359/183, 187, 127, 245; 372/29.011, 29.02, 29.03

(56) References Cited

U.S. PATENT DOCUMENTS

| | | | |
|---|---|---|---|
| 3,569,715 A | 3/1971 | Horning | 359/161 |
| 4,700,150 A | 10/1987 | Hall et al. | 359/279 |
| 4,796,264 A | 1/1989 | Suzuki | 372/29.015 |
| 5,126,876 A | 6/1992 | O'Meara | 359/338 |
| 5,200,964 A | 4/1993 | Huber | 372/26 |
| 5,343,324 A | 8/1994 | Le et al. | 359/184 |
| 5,347,392 A | * 9/1994 | Chen et al. | 359/279 |
| 5,379,309 A | 1/1995 | Logan, Jr. | 372/18 |
| 5,400,417 A | 3/1995 | Allie et al. | 385/2 |
| 5,495,359 A | 2/1996 | Gertel et al. | 359/245 |
| 5,532,857 A | 7/1996 | Gertel et al. | 359/154 |
| 5,654,818 A | 8/1997 | Yao | 359/246 |
| 5,723,856 A | 3/1998 | Yao et al. | 250/227.11 |
| 5,777,778 A | * 7/1998 | Yao | 359/245 |
| 5,796,510 A | 8/1998 | Yao | 359/256 |
| 5,917,179 A | 6/1999 | Yao | 250/227.11 |
| 5,929,430 A | 7/1999 | Yao et al. | 250/205 |

FOREIGN PATENT DOCUMENTS

| | | |
|---|---|---|
| WO | WO00/44074 | 7/2000 |
| WO | WO00/45213 | 8/2000 |

OTHER PUBLICATIONS

Kinsel, Tracy S. "A Stabilized Mode–Locked Nd:YA1G Laser using Electronic Feedback" IEEE Journal of Quantum Electronics, vol. QE–9 (1), Jan. 1973.

Takada et al. "30GHz Picosecond Pulse Generation from Actively Mode–Locked Erbium–Doped Fibre Laser." Electronics Letters, Feb. 1, 1990, vol. 26 (3).

Cowle et al. "Single–Frequency Travelling–Wave Erbium–Doped Fibre Loop Laser." Electronics Letters, Jan. 31, 1991. vol. 27 No. 3.

Grudinin et al. "Nd:YAG Laser Pumped Picosecond $Yb^{3+}$/$Er^{3+}$ Fibre Laser." Electronics Letters, Apr. 9, 1992, vol. 28 No. 8.

Kafka et al. "Picosecond and Femtosecond Pulse Generation in a Regeneratively Mode–Locked Ti:Sapphire Laser." IEEE Journal of Quantum Electronics. vol. 28 (10), Oct. 1992.

Harvey et al. "Harmonically mode–locked fiber ring laser with an internal Fabry–Perot stabilizer for solition transmission." Optics Letters, vol. 18, No. 2., Jan. 1993.

(List continued on next page.)

*Primary Examiner*—Leslie Pascal
*Assistant Examiner*—David Payne
(74) *Attorney, Agent, or Firm*—Fish & Richardson P.C.

(57) ABSTRACT

Systems and techniques for suppressing the carrier signal using an optical delay element and an electrical interferometer in an opto-electronic noise suppression module.

64 Claims, 16 Drawing Sheets

OTHER PUBLICATIONS

Nagarajan et al. "Resonantly Enhanced Semiconductor Lasers for Efficient Transmission of Millimeter Wave Modulated Light." IEEE Photonics Technology Letters, vol. 5 (1), Jan. 1993.

Sugawa et al. "1–6 ps Pulse generation from a 1–3$\mu$m $Pr^{3+}$–doped fluoride fibre laser." Electronics Letters, vol. 29(10), May 1993.

Yao et al. "High frequency optical subcarrier generator." Electronics Letters vol. 30(18), Sep. 1994.

Nakazawa et al. "Ultrastable harmonically and regeneratively modelocked polarisation–maintaining erbium fibre ring laser." Electronics Letters vol. 30(19), Sep. 1994.

Tiemeijer et al. "27–db gain unidirectional 1300–nm polarization–insensitive multiple quantum well laser amplifier module." IEEE Photonics Technology Letters Vo. 6(12), Dec. 1994.

Yoshida et al. "20GHz, 1.8ps pulse generation from a regeneratively modelocked erbium–doped fibre laser and its femotosecond pulse compression." Electronics Letters Vo. 31(5), Mar. 1995.

Yao et al. "A High–speed photonic clock and carrier regenerator." TDA Progress Report 42–121, May 1995.

Yao et al. "Light induced microwave oscillator." Submitted to JOSA–B on Oct. 12, 1995.

Yao et al. "A high speed photonic clock and carrier recovery device." Submitted to IEEE Photonics Technology Letters on Oct. 30, 1995.

Yao et al. "Converting light into spectrally pure microwave oscillation." Optics Letters Vo. 21 (7), Apr. 1996.

Nakazawa et al., "Direct generation of a 50fs, 10HGz pulse train from a regenerativly mode–locked fibre laser with multiple harmonic modulation." Electronics Letters, vol. 32(14), Jul. 1996.

Yao et al. "Light–induced microwave oscillator for photonic systems." IEEE Journal of Quantum Electronics, vol. 32(7), Jul. 1996.

* cited by examiner

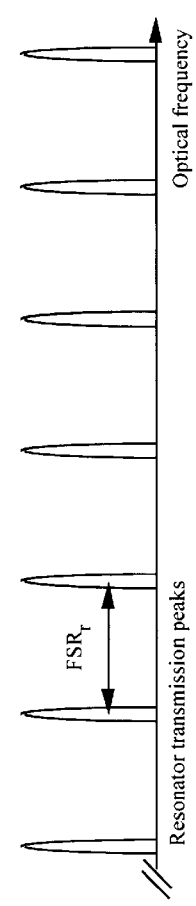
FIG. 3A
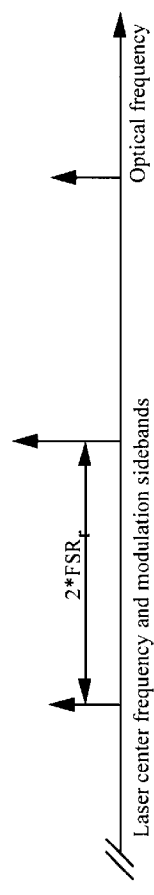
FIG. 3B
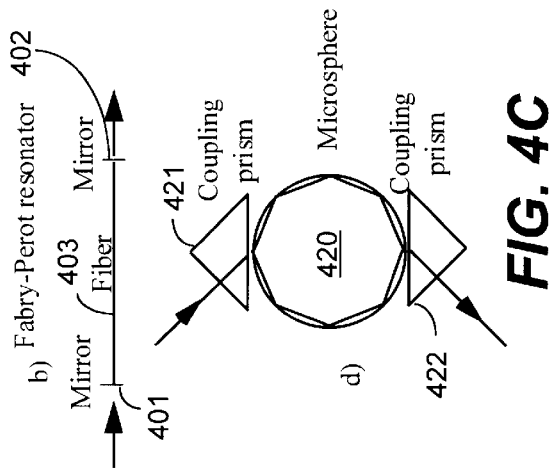
FIG. 4A
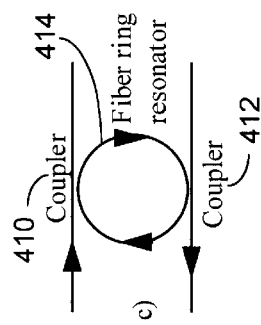
FIG. 4B
FIG. 4C
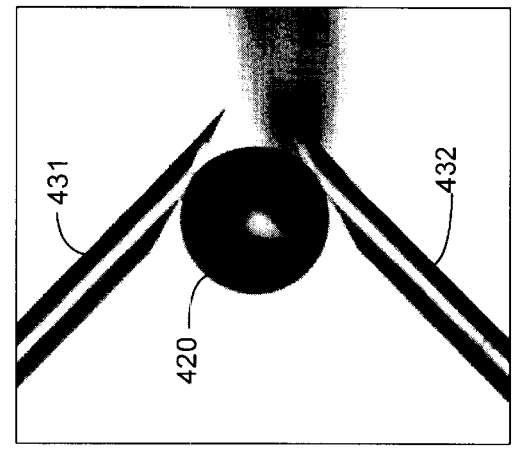
FIG. 4D

OPTO-ELECTRONIC TECHNIQUES FOR REDUCING PHASE NOISE IN A CARRIER SIGNAL BY CARRIER SUPRESSION

This application claims the benefit of U.S. Provisional Application No. 60/117,883 filed on Jan. 28, 1999.

ORIGIN OF THE DISCLOSURE

The systems and techniques described herein were made in the performance of work under a NASA contract, and are subject to the provisions of Public Law 96-517 (35 USC 202) in which the Contractor has elected to retain title.

BACKGROUND

This application relates to techniques and devices for reducing noise in oscillating signals, and more specifically, to techniques and devices for reducing phase noise.

An ideal carrier signal is a signal that oscillates at a single carrier frequency. Information can be imposed on such a single-frequency signal by modulation to produce side bands around the carrier frequency. A modulated carrier signal can then be transmitted to a receiver and is demodulated to recover the information in the side bands.

One common problem in this process is that a carrier signal is usually not so ideal. A carrier signal often has some small side bands that randomly appear around the carrier frequency due to the noise in the carrier generator. These random side bands constitute undesirable phase noise in the carrier and can adversely affect extraction of the useful information from the carrier. In RF or microwave oscillators, electronic components, such as a RF amplifier, often contribute to this phase noise in the carrier signal.

Techniques for reducing such phase noise in RF or microwave oscillator circuits often use a high Q microwave resonator as a frequency discriminator. For example, dielectric resonators and quartz resonators have been used for this purpose.

SUMMARY

The present disclosure includes techniques that use an optical delay element and an electrical interferometer to facilitate reduction of phase noise in a carrier generator.

One embodiment is an opto-electronic device that has an oscillator and a noise suppression module. The oscillator is configured to produce an oscillation signal at a carrier frequency and is responsive to an electrical control signal to change a characteristic of said oscillation signal, such as the phase noise. The noise suppression module is coupled to the oscillator to produce the electrical control signal in response to the oscillation signal.

The noise suppression module includes an opto-electronic unit and an electrical interferometer that are coupled to each other. The opto-electronic unit has an optical delay element, such as a fiber delay loop or an optical resonator, and a photodetector to produce a first electrical signal indicative of the oscillation signal from the oscillator. The electrical interferometer causes interference between the first electrical signal and a second electrical signal which is also indicative of the oscillation signal from the oscillator. This interference produces a first output signal representing a destructive interference and a second output signal representing a constructive interference. The noise suppression module uses this first output signal from the electrical interferometer to generate the electrical control signal. This noise suppression module can be configured as an independent device. An oscillator can be coupled to this device to reduce its output phase noise.

In one implementation, the optical delay element receives an optical signal which is modulated to carry the oscillation signal and the associated phase noise. The optical signal transmits through the optical delay element to produce a time delay in the first electrical signal. One effect of this optical time delay is to increase the sensitivity in detecting phase noise. The phase noise is then extracted from the first output of the electrical interferometer by suppressing the oscillation signal to produce an amplitude signal. The amplitude signal is converted into an electrical control signal to modify the operation of the oscillator to reduce the phase noise.

The oscillator may be any electrically controlled oscillator, including an opto-electronic oscillator, When the oscillator is an opto-electronic oscillator, the opto-electronic unit of the noise suppression module can be coupled to an opto-electronic feedback loop in the oscillator. In addition, all elements of such a device can be configured to integrate on a single semiconductor substrate.

These and other aspects and associated advantages will become more apparent in light of the detailed description, the accompanying drawings, and the appended claims.

BRIEF DESCRIPTION OF THE DRAWINGS

FIGS. 3A and 3B illustrate special relations between the optical frequency of the optical wave in the opto-electronic module and the carrier frequency produced by the oscillator in FIG. 1.

FIGS. 4A, 4B, 4C, and 4D show examples of the optical resonators that can be used as an optical delay element in a noise suppression module according to the disclosure.

DETAILED DESCRIPTION

The devices of this disclosure include an electrically controlled oscillator for generating a carrier signal. The oscillator has a noise suppression module to reduce the output phase noise of the oscillator by producing an electrical control signal to control the operation of the oscillator.

The noise suppression module includes an opto-electronic delay unit to effectuate a delay in the carrier signal and hence to increase the sensitivity in detecting phase noise. The opto-electronic delay unit has an optical delay element to produce a desired amount of delay and to operate as a frequency discriminator. This optical delay element may be an optical delay line such as a fiber loop or an optical resonator with a sufficiently high quality factor Q.

An electrical interferometer is included in the noise suppression module to convert the phase noise into an amplitude signal which is representative of the phase noise. The interferometer is configured to cause interference between a first electrical signal that represents the delayed carrier signal from the opto-electronic module, and a second electrical signal that represents the carrier signal without the delay. The relative phase of the two interfering signals can be adjusted so that a destructive interference occurs in the above amplitude signal to suppress the carrier signal. The phase noise has a random phase and hence is not suppressed in the amplitude signal by the destructive interference. This amplitude signal is then used to produce the electrical control signal to reduce the phase noise in the oscillator.

Figure 1:
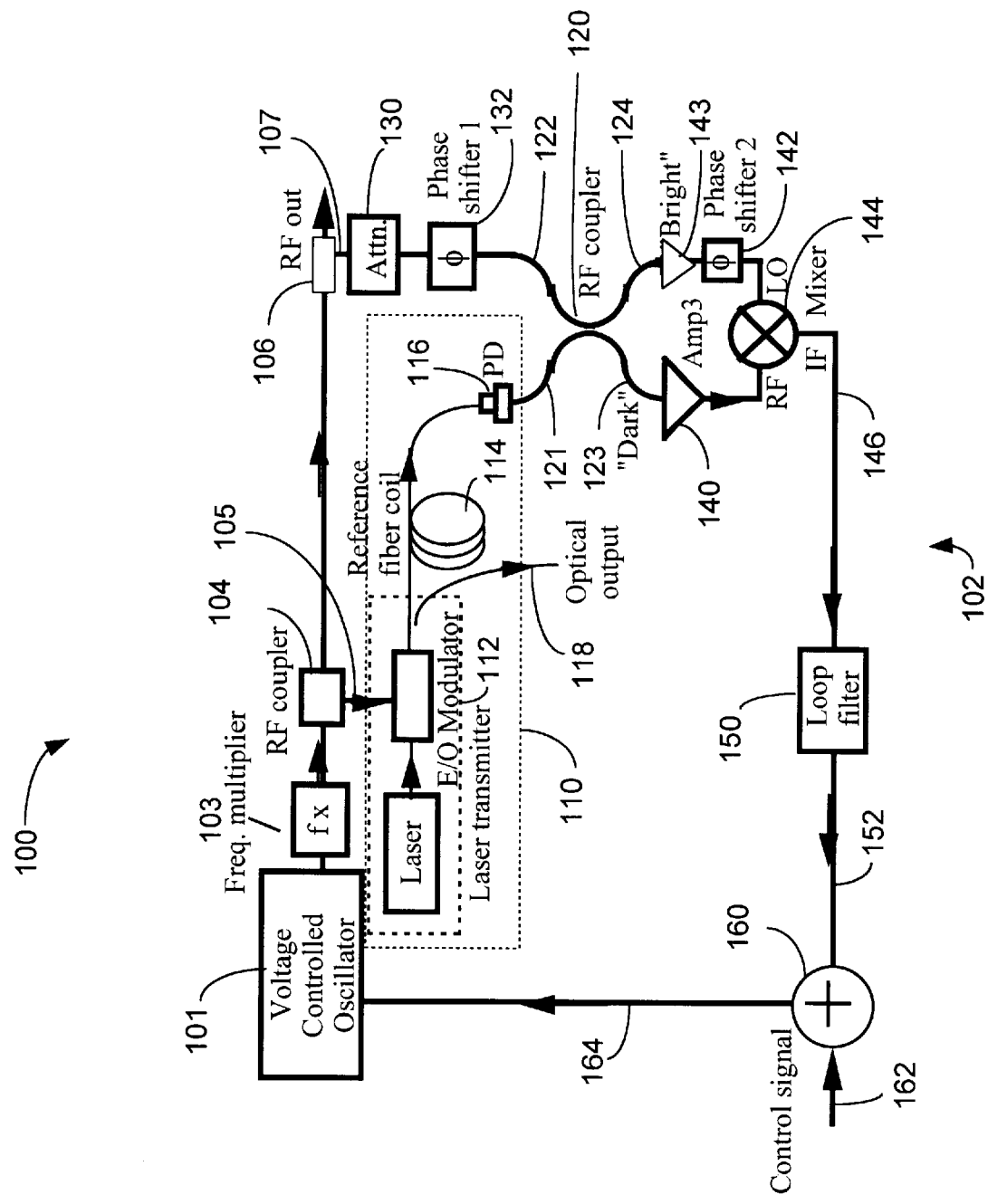
FIG. 1 shows an exemplary device having an electrically controlled oscillator coupled to a phase noise suppression module 1 according to one embodiment of the disclosure.

FIG. 1 shows an exemplary device 100 having an electrically controlled oscillator 101 coupled to a noise suppression module 102 according to one embodiment of the disclosure. The noise suppression module 102 can be an independent device that has an input port and an output control port. Any electrically controlled oscillator can then be plugged into this device to reduce the output phase noise of the oscillator.

The oscillator 101 in general may be any oscillator that generates a carrier signal at a desired carrier frequency. An external electrical control signal, such as a voltage signal, can be used to control the oscillator so that certain characteristic, e.g., the phase nose, of the generated carrier signal can be changed or modified in a desired manner in response to such a control.

Examples of the oscillator 101 include, among others, various voltage controlled RF and microwave oscillators based on dielectric resonators, acoustic resonators (e.g., quartz resonators), microwave cavities, and opto-electronic oscillators. Different from other types of RF and microwave oscillators, an opto-electronic oscillator has an in-phase and active opto-electronic feedback loop to sustain an oscillation in both an electrical signal and an optical signal.

The noise suppression module 102 has two signal couplers 104 and 106 that are coupled in the signal path of the output carrier signal from the oscillator 101 to split a first carrier signal 104 and a second carrier signal 107 from the output carrier signal. Those two carrier signals, after being separately modified, are then combined to interfere with each other as described below.

Each of the signal couplers 104 and 106 may be an optical coupler if the output carrier signal from the oscillator 101 is imposed on an optical wave, or an electrical coupler such as a RF coupler if the output carrier signal is electrical. When the coupler 106 is an optical coupler, a photodetector is needed to covert the coupled optical signal into an electrical signal for an electrical interference operation. In addition, one of the couplers 104 and 106 may be electrical while the other is optical if a specific configuration of the system 100 so requires. In the example shown in FIG. 1, the output of the oscillator 101 is electrical. Hence, both couplers 104 and 106 are electrical couplers. In this case, an electrical frequency multiplier 103 may be optionally coupled between the oscillator 101 and the first coupler 104 to multiply the carrier frequency before the signal splitting.

An opto-electronic unit 110 is implemented in the noise suppression module 102 to have an optical delay element 114 to cause a delay in an optical signal that carries the first carrier signal 105, and a photodetector 116 to convert the optical signal into a first electrical signal 121. The optical delay element 114 can effectively increase the sensitivity in detecting phase noise by an amount proportional to the delay time. Hence, it is generally desirable to have a long delay time.

The opto-electronic unit 110 may have two different configurations depending on the nature of the output carrier signal from the oscillator 101. If the output of the oscillator 101 is electrical, such as the example shown in FIG. 1, the opto-electronic unit 110 may include an electrical controlled laser transmitter 112 to receive and respond to the first electrical carrier signal 105 to produce the optical wave that is modulated to carry the first carrier signal 105. The electrical controlled laser transmitter 112 may be a laser whose output can be modulated in response to the first electrical carrier signal 105, such as a semiconductor laser. Alternatively, the laser transmitter 112 may include a laser and an electro-optical modulator.

On the other hand, if the output of the oscillator 101 is optical, the optical delay element 114 can be directly coupled to the signal coupler 104 to receive the first carrier signal carried by an optical wave. Hence, the laser transmitter 112 may be eliminated from the module 110.

An electrical interferometer 120 is coupled in the module 102 to cause interference between the delayed first carrier signal output from the unit 110 and the second carrier signal produced by the coupler 106. The interferometer 120 has two input ports 121 and 122 and two output ports 123 and 124 to produce two different output signals from the interference. A RF coupler with a desired coupling ratio (e.g., 3 dB) may be used to operate as the interferometer 120.

The relative phase difference and the relative signal strength between the first and second carrier signals can be adjusted so that the first and second carrier signals destructively interfere to produce a "dark" output signal at the output port 123 and constructively interfere to produce a "bright" output signal at the output port 124. This can be achieved by using an adjustable signal attenuator 130 and a variable phase shifter 132. The attenuator 130 and the phase shifter 132 can be coupled together to one of the input ports 121 and 122 such as the port 122 as shown. Alternatively, the attenuator 130 may be coupled to one input port and the phase shifter 132 be coupled to another input port.

The interference in the interferometer 120 occurs only between the coherent components between the first and second carrier signals. Each of the first and second carrier signals includes a coherent carrier signal and the incoherent and random phase noise. Therefore, the destructive interference at the output port 123 only destructs the coherent energy at the carrier frequency and redistributes the energy at the carrier frequency to the constructively interfered output port 124. The phase noise in the input port 123 from the first delayed carrier signal is generally not affected by the interference and transmits through the interferometer 120 as an amplitude signal at the port 123.

Thus, the above interference action in the interferometer 120 suppresses the carrier signal in the destructively interfered output port 123. It is "dark" only in a relative sense that the strength of the carrier signal is suppressed and is weaker than the strength of the carrier signal at the constructively interfered output 124. The output port 123 is in fact not "dark" and still has an amplitude signal converted from the phase noise produced by the oscillator 101 in its output carrier signal. In an actual device, the output signal from the output port 123 may include the amplitude signal converted from the phase noise and the remaining carrier signal..

Figure 2:
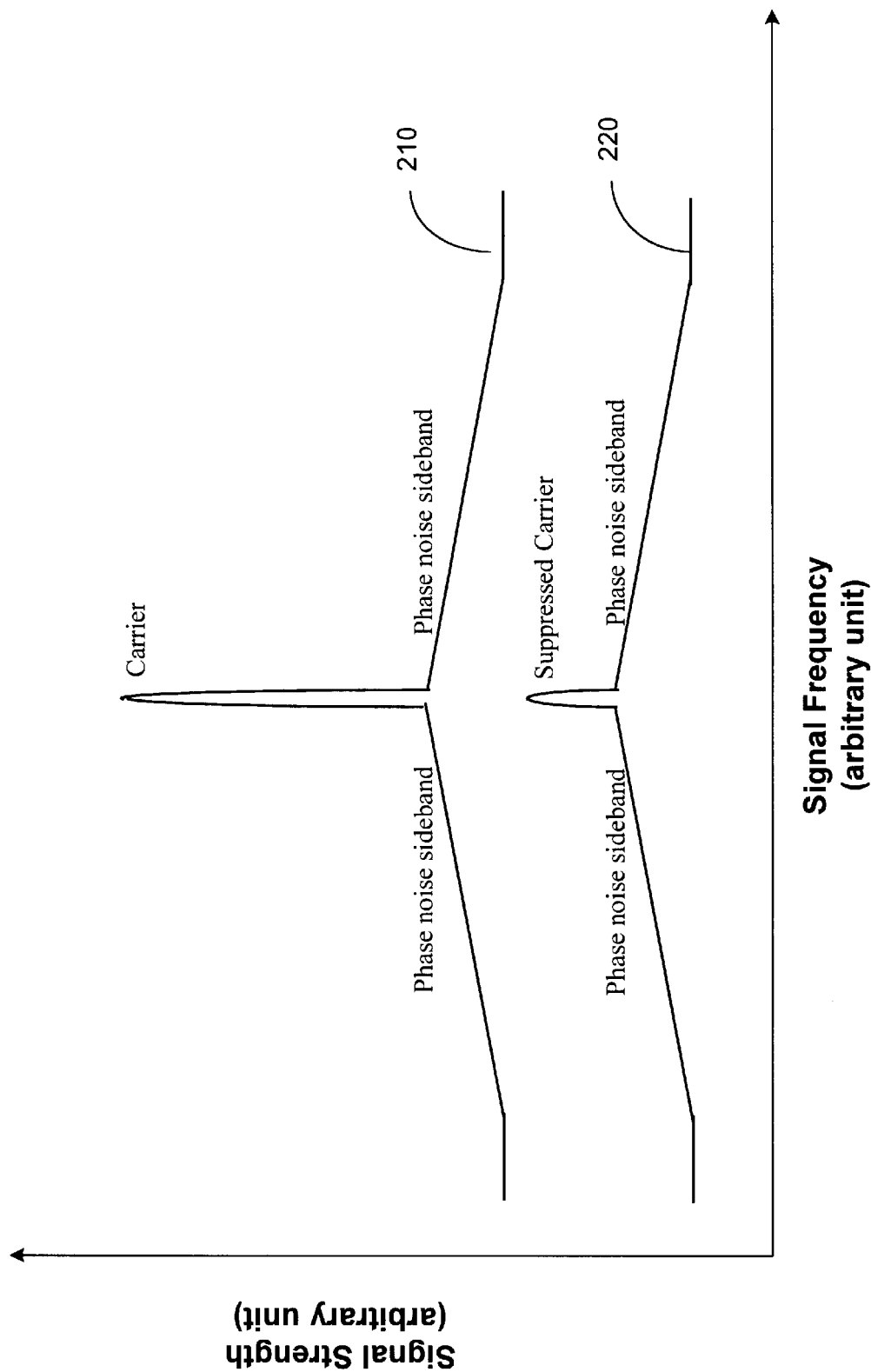
FIG. 2 shows the spectral plots of two signals in the system shown in FIG. 1 to illustrate the effects,of carrier suppression by an interferometer in the phase noise suppression module.

FIG. 2 shows the spectral plots of the output carrier signal 210 of the oscillator 101 before entering the interferometer 120 and the output signal 220 at the output port 123 with the carrier signal suppressed. Although the carrier signal may not be completely eliminated in an actual device, the phase noise is enhanced relative to the carrier signal in the output port 123. This relative enhancement of the phase noise can facilitates extraction of the phase noise information to control the oscillator 101 for noise reduction.

Referring back to FIG. 1, the destructively interfered output port 123 is coupled to an electrical signal amplifier 140 to amplify the signal. This is to obtain a sufficiently large amplitude signal component that is contributed by the phase noise. Another signal amplifier 143 may be optionally connected to amplify the signal from the port 124. A RF signal mixer 144 is coupled in the module 102 to receive the amplified amplitude signal from the port 123 at its RF input port and the output from the port 124 at its local oscillator (LO) port to produce an intermediate frequency (IF) signal 146 at the IF port. The mixing operation by the mixer 144 produces a beat signal between the RF and LO ports and hence the output signal 146 is substantially free of the carrier signal and the signal component contributed by the phase noise of the oscillator 101 is the primary portion. A low-pass electrical filter 150 is used to filter the signal 146. The bandwidth of the filter 150 is set at values that would not cause oscillations in the feedback loop. The output signal 152 of the filter 150 is then fed back to the oscillator 101 as a control signal to reduce its phase noise.

The RF mixer 142 is a phase sensitive device. The relative phase between the signals to the RF and LO ports of the mixer 144 may be M π, where M =0, ±1, ±3, . . . . A phase shifter 142 can be coupled to either to the RF port or the LO port of the mixer 144 to achieve this phase condition. Under this phase condition, the output of the mixer 144 is affected by the amplitude noise in the input signals but not their phase noise. Thus, any effect of the phase noise from the components in the module 102 on the signal 146 is substantially reduced.

One benefit of this operating configuration of the mixer 144 is that, the phase noise of a RF amplifier used in the module 102 does not significantly limit the noise performance of the system 100. The phase noise in many RF amplifiers is usually greater than the amplitude noise and hence is the primary source of noise. Hence, the performance of some noise suppression techniques for RF oscillators is often limited by the phase noise of the RF amplifiers.. This is no longer the case in the system 100 or other systems based on the system 100.

In addition, because the amplifier 140 amplifies the carrier suppressed "dark" output, the probability of saturating the amplifier 140 can be reduced. Consequently, the amplifier 140 can maximize the detected frequency noise (the "error signal") and deliver it the mixer 144. Moreover, because the RF bridge 120 is insensitive to the amplitude noise, the laser relative intensity noise (RIN) contribution to the oscillator 101 can be significantly reduced. With this noise reduction setup, the final phase noise is expected to be limited by the phase noise of the photodetector 116.

The system 100 may also include an optional signal adder 160 between the oscillator 101 and the filter 150 so allow an external electrical signal 164 to be coupled to control the oscillator 101.

In the system 100, the optical delay element 114 acts as a frequency discriminator for the carrier suppression interferometer 120 to convert the frequency jitter in the carrier signal from the oscillator 101 into amplitude jitter. FIG. 1 shows a fiber delay loop as the element 114. Other optical delay devices may also be used. In particular, various optical resonators can function as the delay element 114.

When an optical resonator is used as the delay element 114, special relations should be satisfied between the optical frequency of the optical wave in the opto-electronic module 102 and the RF carrier frequency of the oscillator 101. When the output of the oscillator 101 is electrical, the optical frequency of the optical wave is the output frequency of the laser transmitter 112. When the output of the oscillator 101 is an optical signal modulated to carry the RF carry signal (e.g., as in an opto-electronic oscillator), the optical frequency is the frequency of the optical wave output by the oscillator 101.

FIGS. 3A and 3B illustrate the relations. First, the center frequency of the optical wave is within one of the transmission peaks of the resonator to allow the optical carrier to pass the resonator. Second, the RF frequency is the multiple of the free spectral range, ($FSR_r$) of the resonator to allow the modulation sidebands to pass the resonator with minimum loss. An example for the RF frequency being double the $FSR_r$ of the resonator is shown in FIG. 3B.

An optical resonator can be implemented as the optical delay element 141 in different configurations. For example, fiber Fabry-Perot resonators, fiber ring resonators, optical microsphere resonators, and other micro-resonators can be used. The use of optical resonators of high Q factors can significantly reduce the size of the device 100 shown in FIG. 1. In particular, the optical microsphere resonator and other types of micro resonators based on whispering gallery modes may be used to integrate the entire device on a single chip.

FIG. 4A shows a compact and light weight Fabry-Perot resonator constructed by forming highly reflective coatings 401 and 402 on two ends of a segment of optical fiber 403 to form a fiber Fabry-Perot resonator. An alternative way to make a fiber Fabry-Perot resonator is to form fiber Bragg gratings at or near both ends to replace the reflective coatings 401 and 402. Light coupling into the resonator bounces back and forth inside the resonator before exiting so that the effective energy storage time dramatically increases.

FIG. 4B shows another suitable optical resonator formed by a fiber ring 414. Such a ring resonator can be fabricated by coupling two fiber directional couplers 410 and 412 to the fiber ring 414. Light coupled into the fiber ring 414 circulates many times before exiting. The resulting effective energy storage time depends on the coupling ratios and excess losses of the couplers 410 and 412.

FIG. 4C shows a micro whispering-gallery-mode resonator with even smaller size and weight than the above resonators. This resonator includes a transparent micro sphere, a ring, or a disk 420 as the cavity and two optical couplers 421 and 422. Quality-factor Q of such a resonator is limited by optical attenuation in the material and scattering on surface inhomogeneities, and can be as high as $10^4$–$10^5$ in microrings and disks, and up to $10^{10}$ in microspheres. The material for the cavity 420 may be a variety of dielectric materials, including fused silica which is a low loss material for optical fibers. Each coupler may be a prism or in other forms.

Light is coupled into and out of the micro resonator 420 in whispering-gallery modes through the evanescent fields at the surface of the sphere 420 that decays exponentially outside the sphere 420. Once coupled into the sphere 420, the light undergoes total internal reflections at the surface of the sphere 420 in a similar fashion as light propagating in an optical fiber. The effective optical path length is increased by such circulation, just like in a fiber ring resonator.

FIG. 4D shows an alternative microsphere resonator using two fibers 431 and 432 as the couplers. The end surfaces of both fiber couplers.431 and 432 are cut at a desired angle and are polished to form micro-prisms. The two fiber couplers 431 and 432 may be implemented by using two waveguides formed in a substrate.

In practical applications, fluctuations of the environmental conditions and aging of the device components, such as variations in temperature, stress, or other type disturbances, can cause changes in both the transmission peak frequencies of the resonator and the laser frequency $v_{laser}$ from a laser that produces the optical wave in the opto-electronic module 102. This laser may be the laser transmitter 112 when the output of the oscillator 101 is electrical, or a laser located within the oscillator 101 that produces an optical output modulated to carry the RF carrier signal.

Hence, the relative value of the laser frequency $v_{laser}$ and a respective resonant transmission peak of the resonator can change over time in absence of a control mechanism. Such a change, when exceeding a range, can destroy the mode matching condition shown in FIGS. 3A and 3B.

Therefore, it is desirable to control the difference between the laser frequency $v_{laser}$ and a respective transmission peak of the resonator. This can be achieved by either actively locking the frequency $v_{laser}$ of the laser to the respective transmission peak of the resonator, or alternatively, actively locking the resonator to the laser. The choice of these two frequency locking techniques depend on which one is more environmentally stable in a specific application. In both active locking techniques, a monitoring mechanism is used to monitor the difference between the laser frequency $v_{laser}$ and the respective transmission peak of the resonator 121 to generate an error signal. Then, in response to this error signal, a frequency correcting mechanism is used to reduce the frequency difference to a value with a tolerable difference range.

Figure 5A:
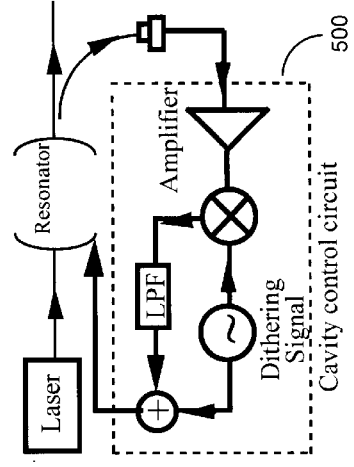
FIGS. 5A and 5B show two implementations of an active control of the relative frequency between a laser and a resonator that receives an optical beam produced by the laser.
Figure 5B:
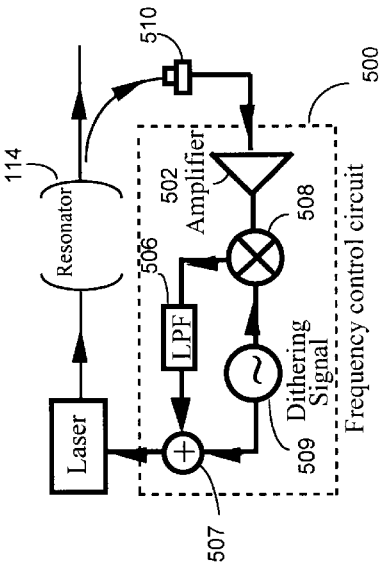

FIGS. 5A and 5B show two implementations of the active control of the relative frequency between the laser and the resonator 114. Both implementations:use a frequency control circuit 500 which detects the frequency difference and applies a control signal either to the laser or to the resonator 114. The input of the circuit 500 is coupled to receive an electrical signal converted from the optical output of the optical resonator 114. A designated photodetector 510 may be used to produce the input to the circuit 500.

One embodiment of the frequency control circuit 500 includes a signal phase detector 508, a low-pass filter 506, a dithering signal generator 509, and a signal adder 507. A signal amplifier 502 may be used to amplify the input signal to the phase detector 508. The dither 509 produces a periodic dither of a frequency fd, e.g., a sinusoidal dither signal. This dither signal is coupled to provide the same dither signal to both the adder 507 and the phase detector 508. In operation, the phase detector 508 compares the phase of the dither signal to that of the output from the resonator 114 to produce a first error signal. After being filtered by the low-pass filter 506, the first error signal and the dither signal are added to form a second error signal that is fed to either the laser as shown in FIG. 5A or the resonator 114 as shown in FIG. 5B to reduce the frequency difference.

Referring back to FIG. 1, the electrical controlled oscillator 101 can be an opto-electronic oscillator ("OEO"). Such an OEO includes an electrically controllable optical modulator and at least one active opto-electronic feedback loop that comprises an optical part and an electrical part interconnected by a photodetector. The opto-electronic feedback loop receives the modulated optical output from the modulator and converted it into an electrical signal to control the modulator. The loop produces a desired delay and feeds the electrical signal in phase to the modulator to generate and sustain both optical modulation and electrical oscillation in RF or microwave ranges when the total loop gain of the active opto-electronic loop and any other additional feedback loops exceeds the total loss. See, U.S. Pat. Nos. 5,723,856 and 5,777,778, the entirety of which is incorporated herein by reference.

When an OEO is used as the oscillator 101, the noise suppression module 102 can be coupled to either an optical output or an electrical output of the OEO to produce the electrical control signal 146. A electrical controlled phase shifter is then used to control the electro-optical modulator in the OEO in response to the control signal 146 to reduce the phase noise.

Figure 6:
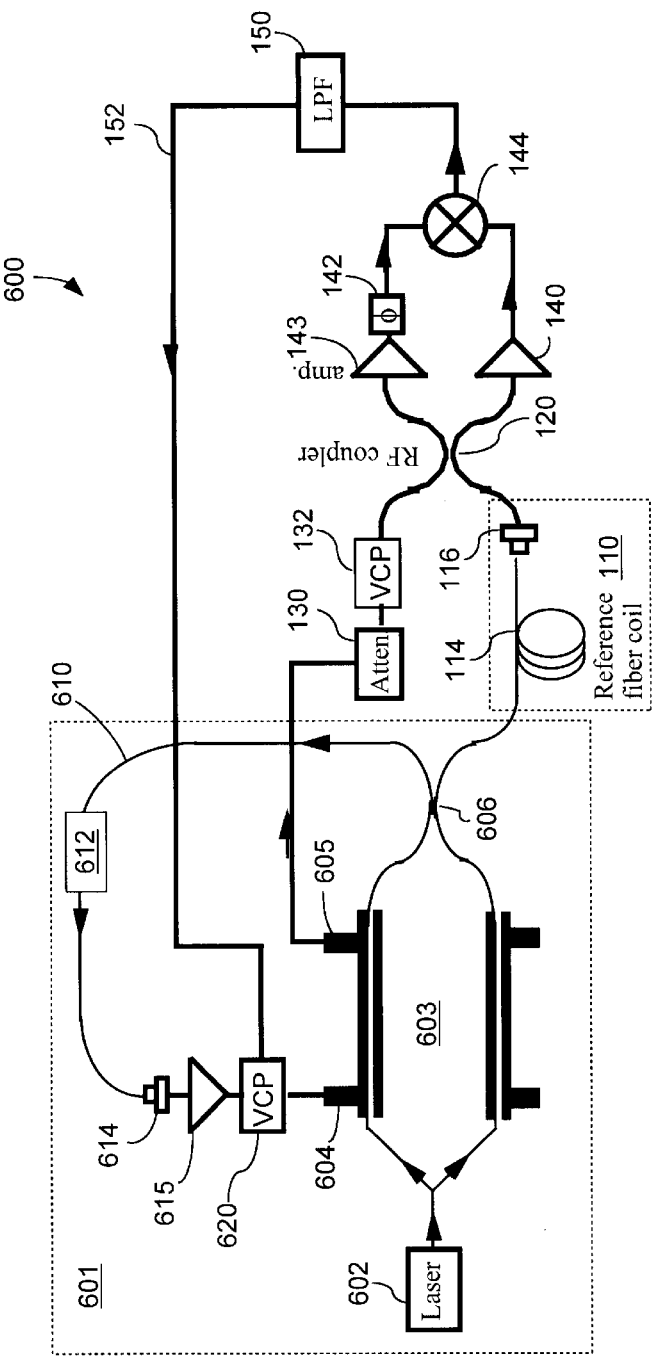
FIGS. 6 and 7 show two exemplary systems having a single-loop opto-electronic oscillator coupled to a noise suppression module.

FIG. 6 shows one exemplary system 600 of a single-loop opto-electronic oscillator 601 coupled to a noise suppression module similar to the module 102 in FIG. 1. The OEO 601-includes a light source 602, an electro-optic ("EO") modulator 603, and an opto-electronic feedback loop 610 coupled to the EO modulator 603. A light beam from the light source 602 is coupled into the EO modulator 603. The EO modulator 603 is properly biased to modulate the light in response to a feedback signal from the feedback loop 610 that is applied to a RF driving port 604. This feedback causes the light modulation to oscillate at a desired frequency such as a RF frequency and to produce an modulated optical output at an output port 606.

The feedback loop 610 includes an optical section that receives one portion of the optical output of the modulator 603. An optical delay element 612, such as an optical fiber loop or an optical resonator, is included to produce a desired delay in the loop 610. Various resonators including those in FIGS. 4A through 4D can be used as the optical delay element 612 in the device 600 and other OEOs. The output of the delay element 612 is converted into an electrical signal by a photodetector 614 as a feedback input to the RF driving port 604. An amplifier 615 can be coupled in the loop 610 to ensure the loop gain to exceed the loop loss.

Another portion of the optical output from the port 606 is sent to the opto-electronic unit 110 of the noise suppression module. Notice that a laser transmitter is not needed here since an optical output from the OEO 601 is used. Alternatively, if the output form the OEO 601 is electrical, e.g., from a RF port 605, then a laser is needed in the unit 110. This generates the first carrier signal to the interferometer 120. Another carrier signal to the interferometer 120 is obtained from the RF port 605 of the EO modulator 603. The output control signal 152 is coupled to the RF port 604 via an electrical controlled phase shifter 620 that is coupled between the amplifier 615 and the port 604 to control the phase of the feedback control signal from the loop 619. This phase is adjusted in response to the phase noise in the OEO and to compensate the phase noise.

Figure 7:
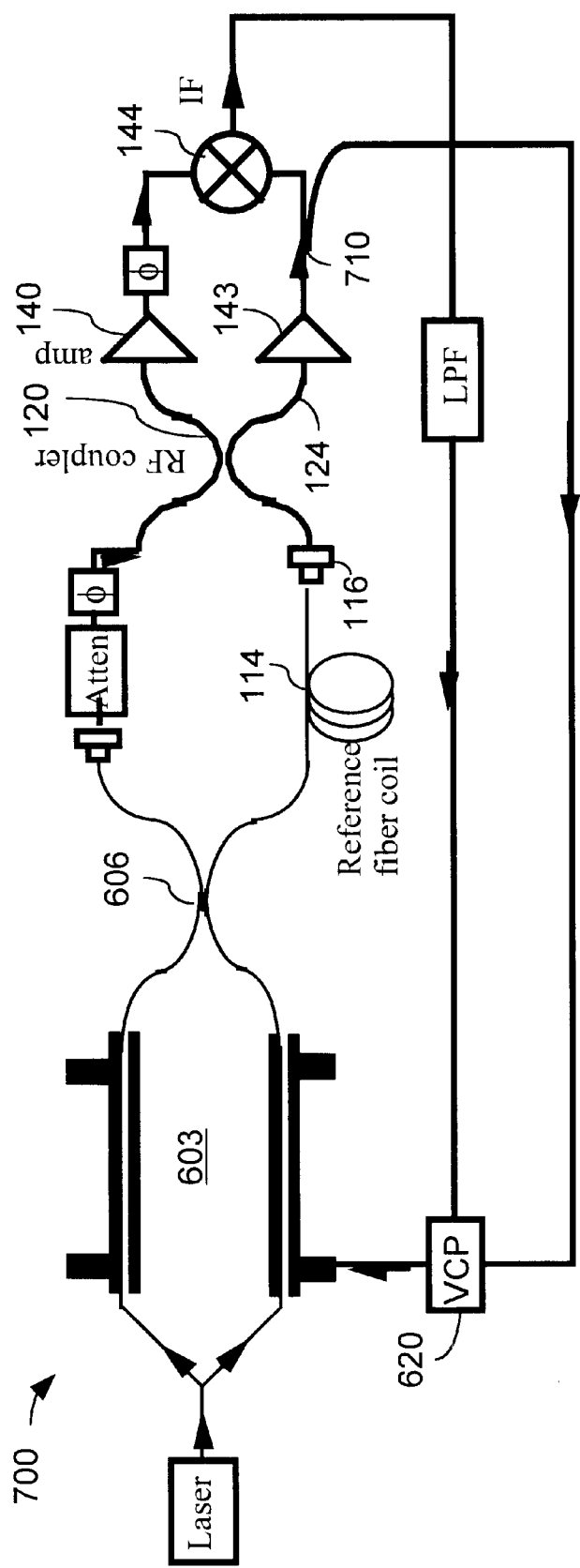

FIG. 7 shows another example of a single-loop OEO coupled with a noise suppression module. The active oscillating opto-electronic loop for the OEO is coupled with a portion of the noise suppression module. An electrical coupler 710 is disposed in the output of the constructively interfered port 124 between the amplifier 140 and the mixer 144 to produce the positive feedback signal to the EO modulator 603. Hence, the oscillating feedback loop for the OEO includes the optical delay element 114, the photodetector 116, the interferometer 120, the port 124, the amplifier 143, the coupler 710, and the phase shifter 620. Hence, the OEO and the noise suppression module share a common optical delay element 114.

Figure 8A:
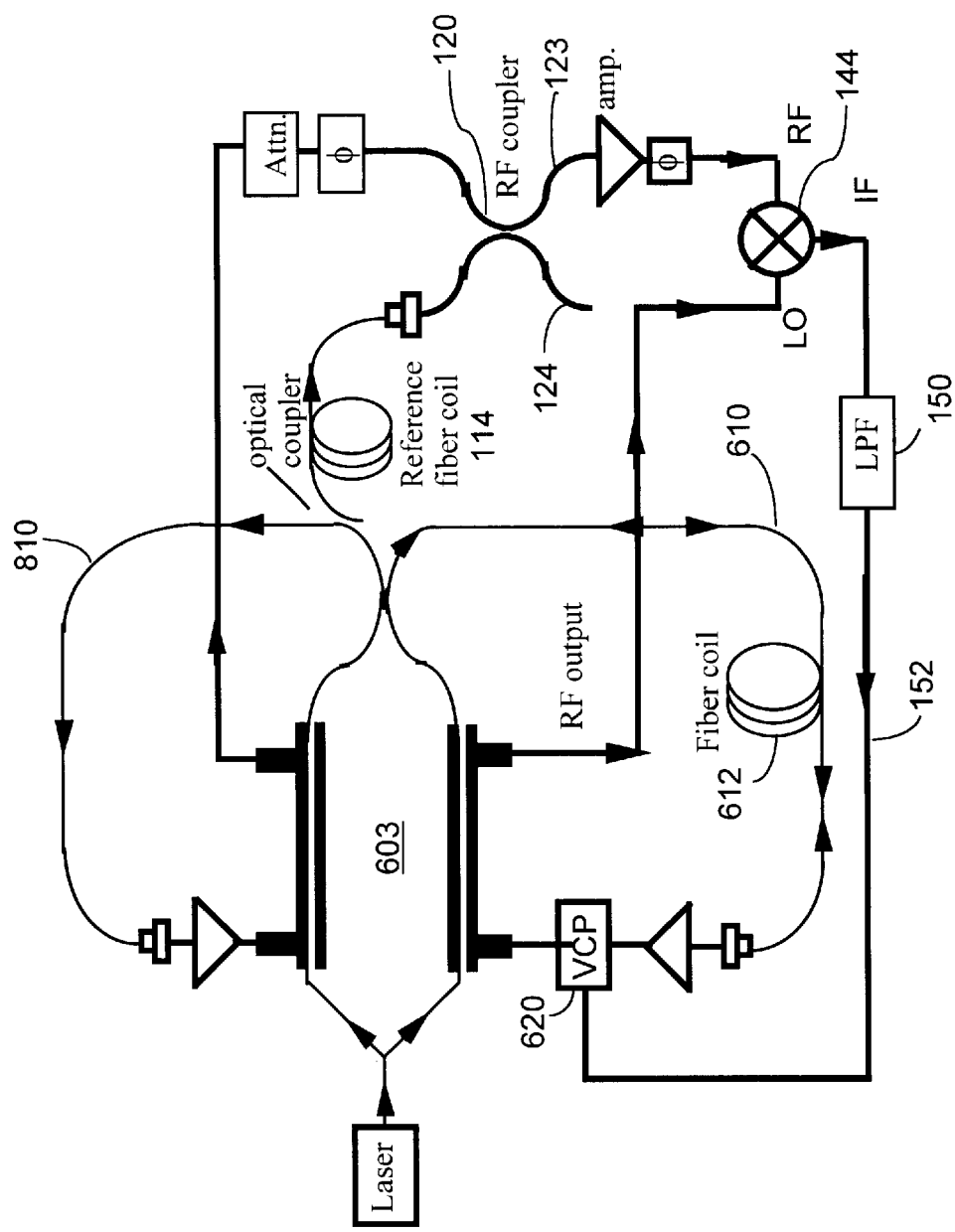
FIGS. 8A, 8B, 8C, and 9 show examples of an opto-electronic oscillator having a noise suppression module and two oscillating feedback loops.
Figure 8B:
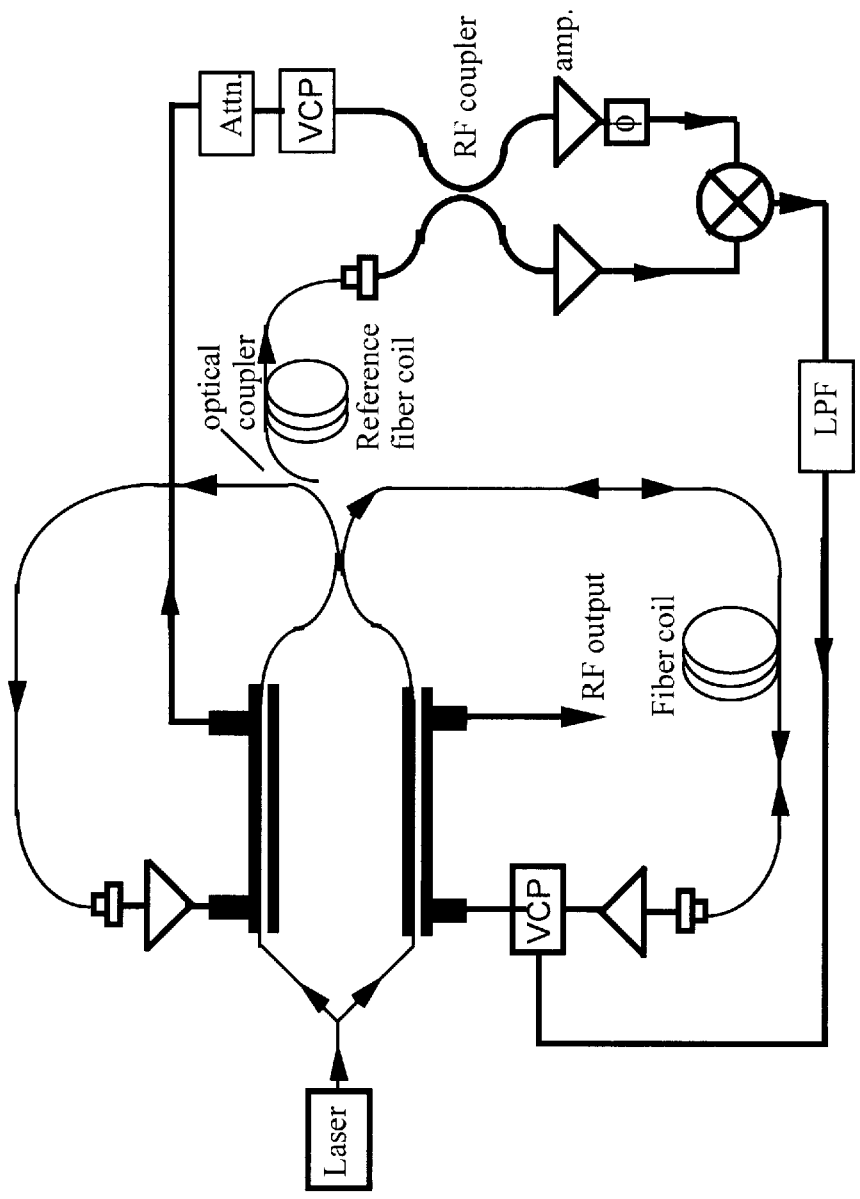
Figure 8C:
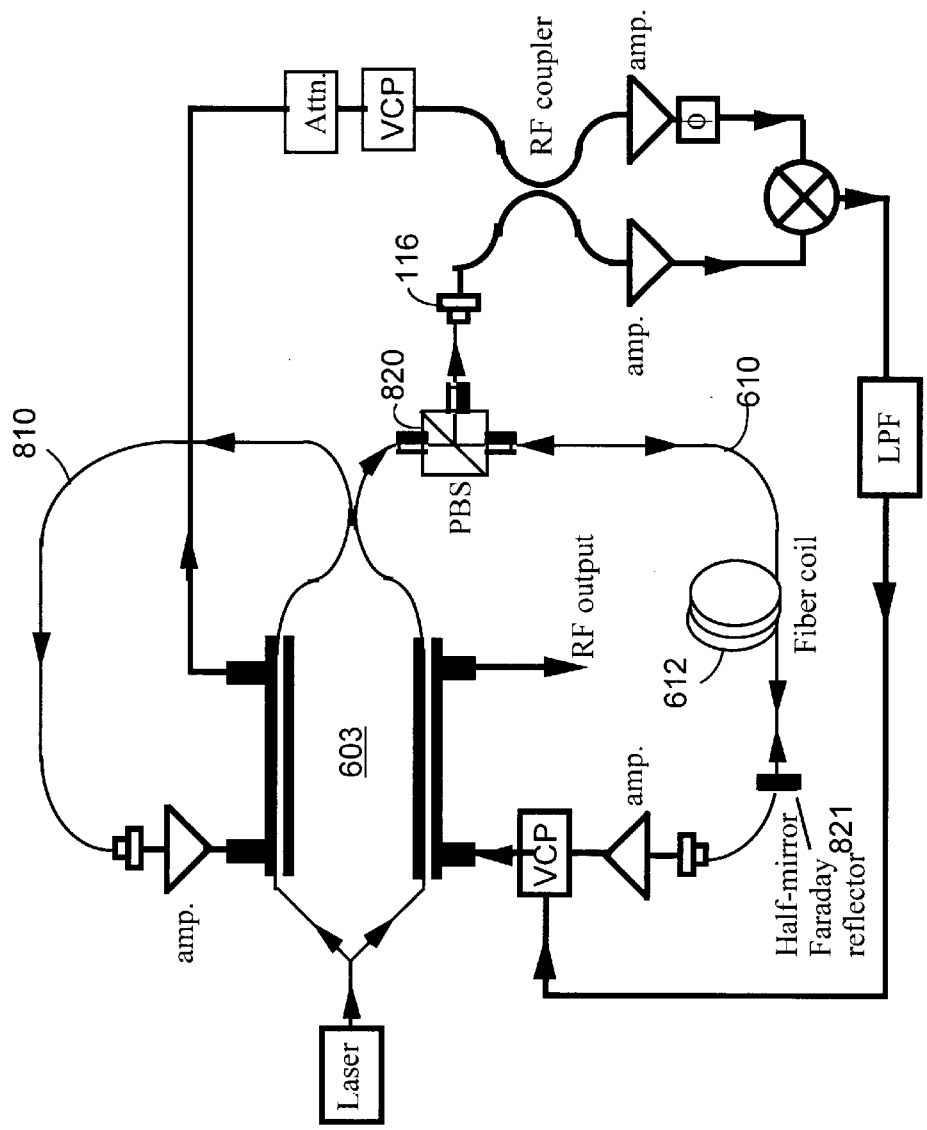

FIGS. 8A, 8B, and 8C show three examples of a double-loop OEO coupled to a noise suppression module.

The device shown in FIG. 8A uses two opto-electronic loops 810 and 610 to form the two oscillating feedback loops of different delays for the OEO. The noise suppression module receives three different inputs to generate the noise control signal 152. The two inputs to the interferometer 120 are generated from an optical output and a RF output from the OEO, respectively. The input to the LO input port of the mixer 144 is obtained from another RF output of the OEO. The signal from the constructively interfered output port 124 can be used as an output.

A polarizing beam splitter 820 and a partial Faraday reflector 821 are implemented in the device in FIG. 8C to allow the noise suppression module and the OEO to share the same optical delay element 612. The PBS 820 is oriented so allow a polarizing optical output of the OEO to transmit through to reach the partial Faraday reflector 821 after passing through the optical delay element 612. The Faraday reflector 821 includes a Faraday rotator and a partial reflector. The polarization of the reflected beam is rotated 90 degree by the Faraday reflector, and, after passing through the optical delay element 612 for the second time, is reflected by the PBS 820 into the photodetector 116. The optical delay for the noise suppression is twice as much as the delay for the OEO loop 810. The PBS 820 and the partial Faraday reflector 821 can be substituted by an optical circulator and a partial reflector, respectively, to achieve the same function.

Figure 9:
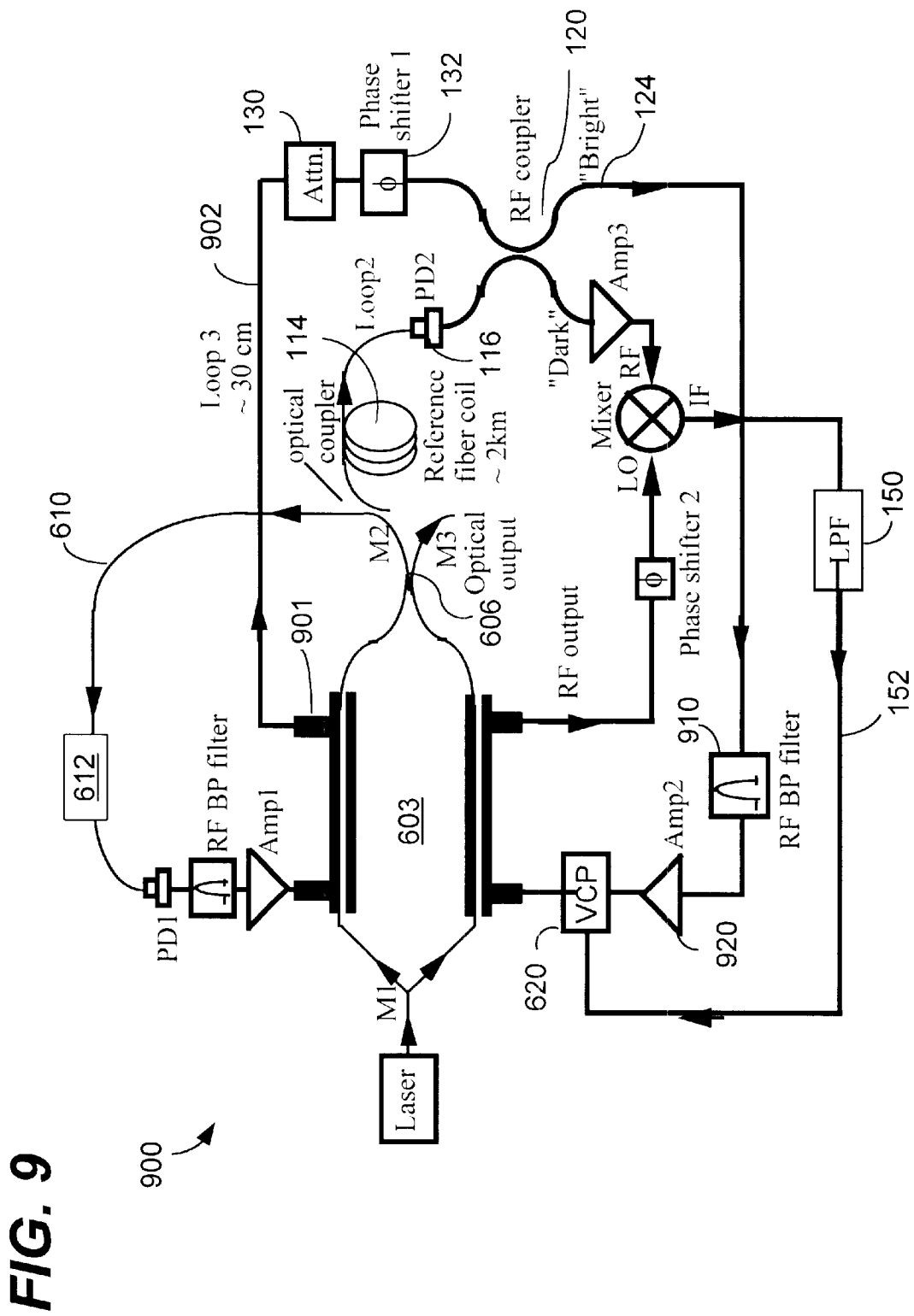

FIG. 9 shows a device 900 having a triple-loop OEO incorporating a noise suppression module. See, X. Steve Yao and Lute Maleki, "MULTI-LOOP OPTO-ELECTRONIC OSCILLATOR", J. of Quantum Electronics, vol. 36, No. 1, pp. 79–84 (2000). The OEO has three feedback loops. The first loop is an oscillating opto-electronic loop 610 as shown. The loop 2 begins from the optical output 606 and goes through the optical delay element 114 and the photodetector 116 to the interferometer 120. The loop 3 begins from the RF port 901 of the EO modulator 603 and goes through a RF delay line 902, the attenuator 130, and the phase shifter 132 to the interferometer 120. The two loops are combined at the interferometer 120 to form a composite feedback loop. The remaining part of this composite includes the constructively interfered port 124, a RF bandpass filter 910, an amplifier 920, and the voltage controlled phase shifter 620.

The noise suppression module also has an opto-electronic loop which does not oscillate and operates to produce the noise control signal 152.

Since the "bright" port 124 of the interferometer 120 is within the composite feedback loop, the signal strength at this port is automatically maximized for the oscillation signal. At the same time, signal strength at the "dark" port 123 is automatically minimized. Hence, the OEO can automatically adjust its frequency to operate at nearly-optimized carrier suppression condition. Long term locking of the feedback loop can be achieved against certain slow changes in the device, such as the temperature drift, despite of the limited range of the VCP 620.

Figure 10A:
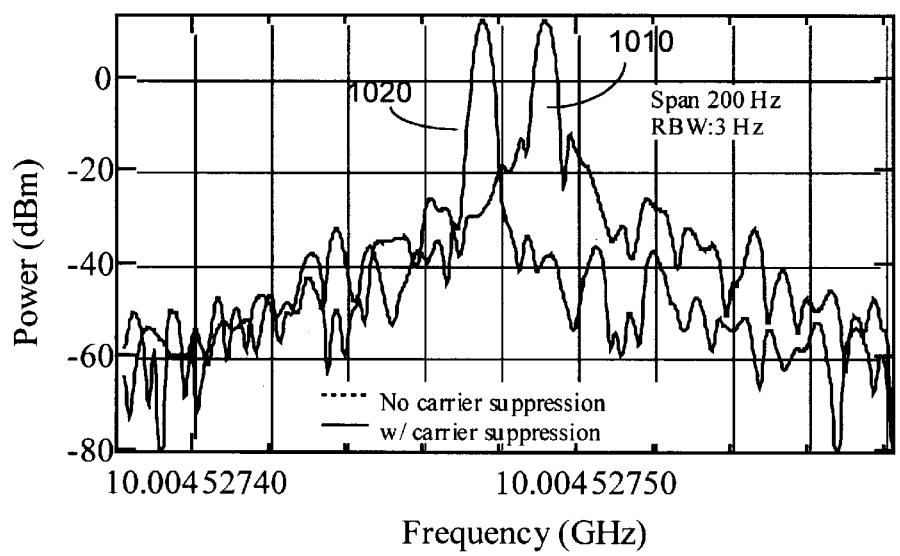
FIGS. 10A and 10B show measurements obtained in the device shown in FIG. 9.
Figure 10B:
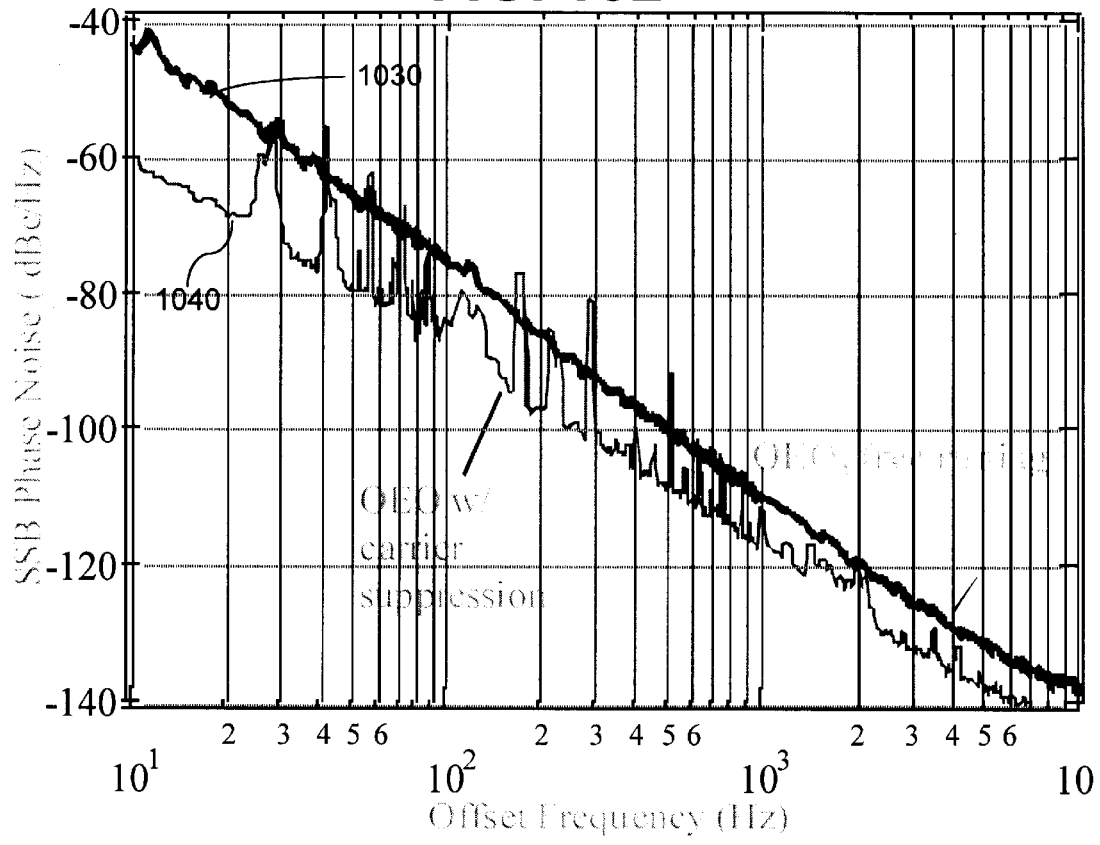

FIGS. 10A and 10B show measurements obtained in the above system 900 when the delay element 612 was implemented by a 4-meter fiber loop. A carrier suppression greater than 40 dB was observed when the feedback loop was locked. FIG. 10A is the measured:RF spectra of the system 900 for a RF oscillation frequency at about 10 GHz, with and without the noise reduction based on the carrier suppression. Curve 1010 represents the spectrum when the noise suppression module is turned off. Curve 1020 is the spectrum when the noise suppression module is turned on. The spectra were taken with an HP8563E spectrum analyzer. The span and resolution bandwidth of the spectrum analyzer were set at 200 Hz and 3 Hz, respectively. The data suggests that the spectral purity of the OEO was improved significantly (~20 dB) with the carrier suppression circuit active. FIG. 10B shows measured phase noise of the oscillator with (curve 1030) and without (curve 1040) carrier suppression.

The opto-electronic loop 610 in the device 900 in FIG. 1 may be eliminated. In addition, the RF input to the LO input of the mixer can be obtained anywhere in the system as long as it is a copy of the RF carrier oscillation generated from the OEO.

Brillouin Opto-electronic oscillators can also be used to as the oscillator 101 in the system.100 in FIG. 1. A Brillouin OEO uses at least one active opto-electronic feedback loop that generates an electrical modulation signal based on the stimulated Brillouin scattering in a Brillouin optical medium in the loop. See, e.g., U.S. Pat. No. 5,917,179 to Yao, which is incorporated by reference in its entirety. An optical pump laser beam is injected into the Brillouin optical medium to produce an acoustic grating moving in the direction of the pump laser beam due to the electrorestrictive effect. The grating interacts with the pump laser beam to produce a backscattered Brillouin scattering signal at a frequency $v_B$ less than that of the pump laser beam $v_p$ by a Doppler shift $v_D$, i.e., $$v_B = v_P - v_D$$

The Brillouin scattering signal is converted into an electrical modulation signal by a photodetector in the opto-electronic feedback loop.

Figure 11:
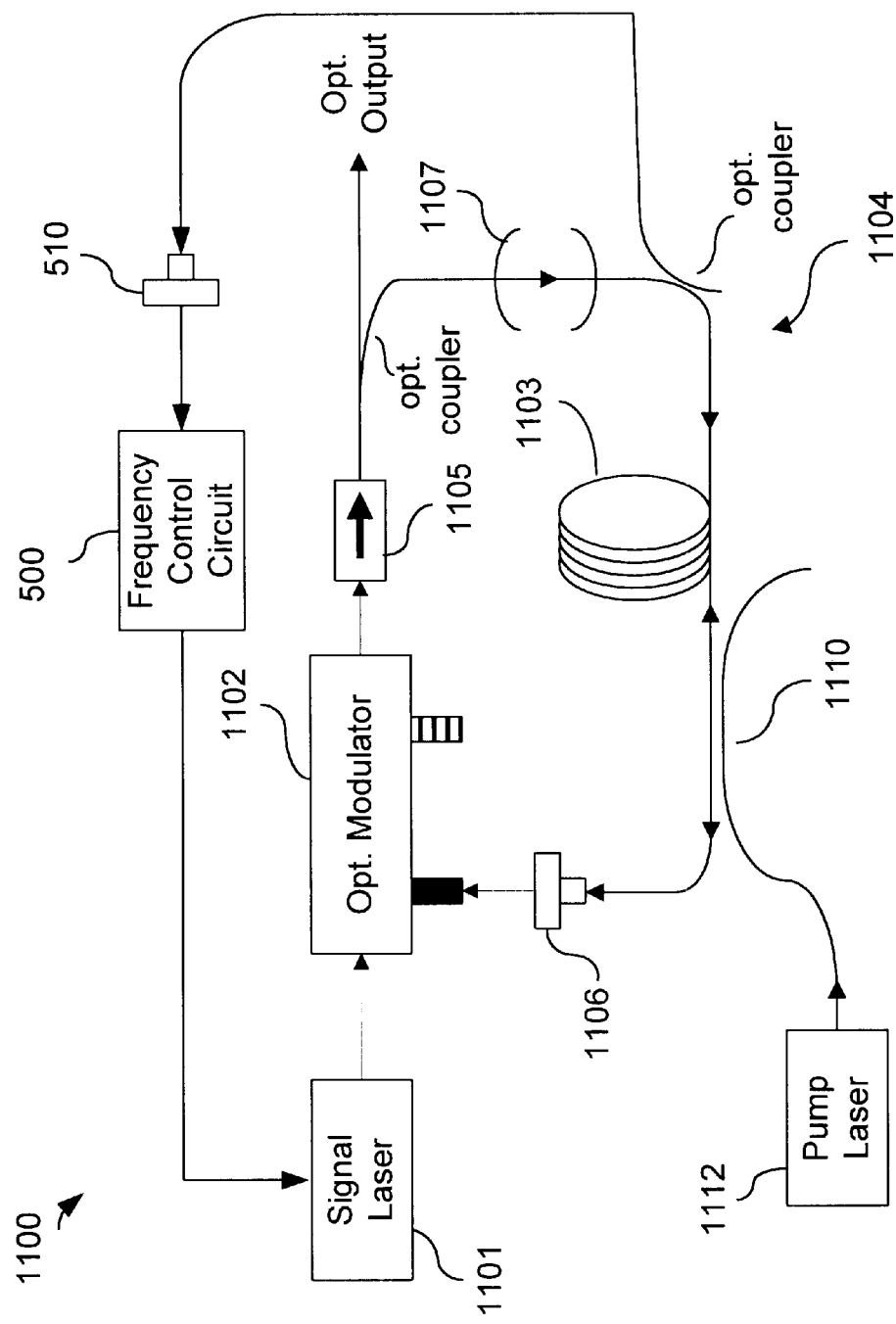
FIGS. 11 and 12 show two exemplary Brillouin OEOs that can be used as the oscillator in FIG. 1.
Figure 12:
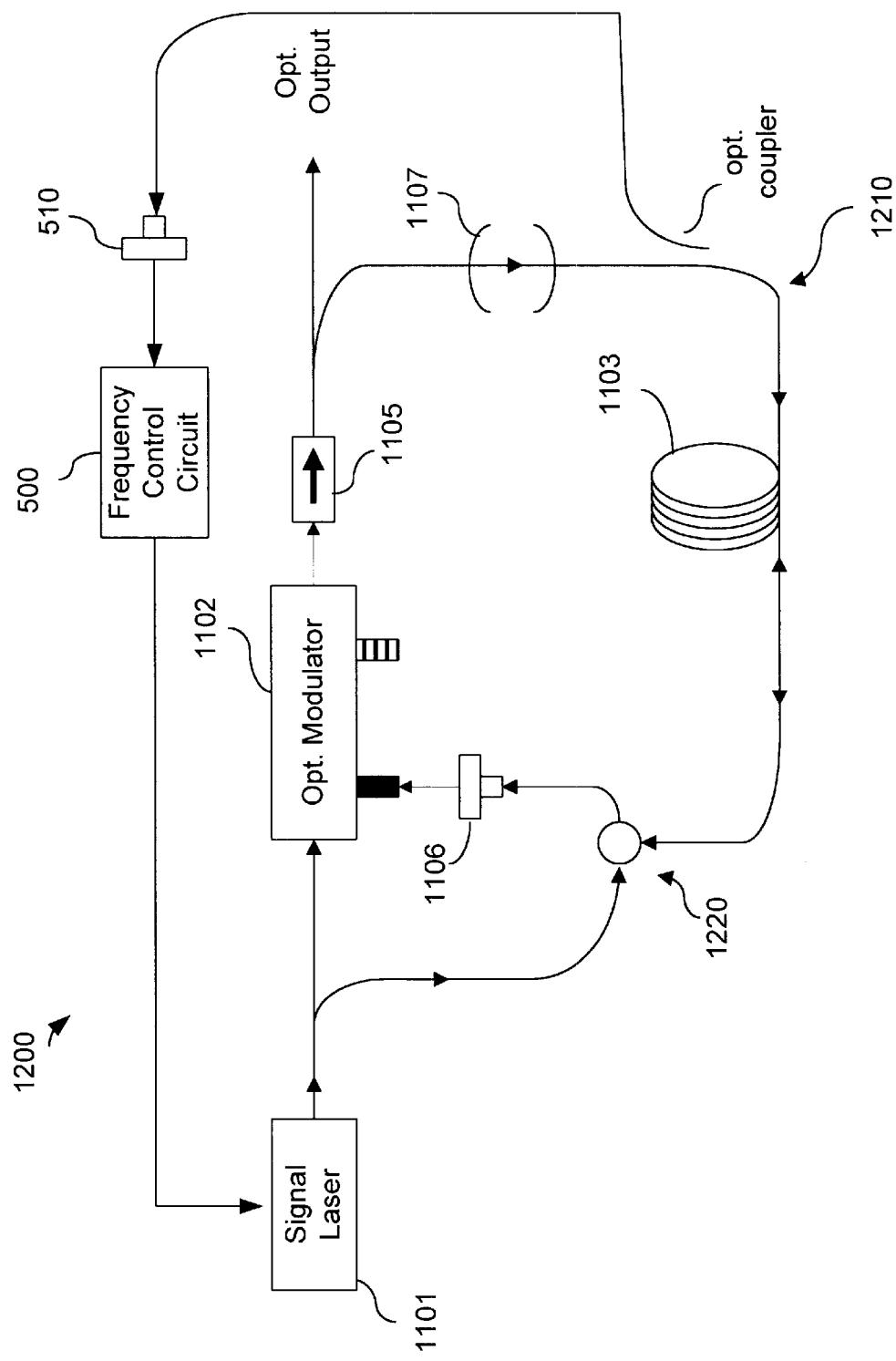

FIGS. 11 and 12 show two exemplary Brillouin OEOs that can be used as the oscillator 101 in FIG. 1. The OEO 1100 in FIG. 11 uses two separate lasers 1101 and 1112. The EO modulator 1102 uses the electrical modulation signal of the feedback loop 1104 to modulate an optical carrier produce by the laser 1101 to generate a modulated optical carrier signal which is modulated at an oscillation frequency $$f_{osc} = |v_B - v_s| = |v_P - v_s - v_D|.$$

The Brillouin medium is a segment of optical fiber 1103 in the loop 1104. The pump laser 1112 is coupled into the fiber 1103 by a coupler 1110 in an opposite direction to the direction of the modulated optical carrier coupled into the loop 1104. The Brillouin scattering signal is in the direction of the optical carrier signal. The photodetector 1106 receives the Brillouin scattering signal and the optical carrier signal to produce the electrical modulation signal. FIG. 12 shows a Brillouin OEO 1200 that uses a single laser 1101 to produce both the pump laser and the signal laser. An optical circulator 1220 is used to couple a portion of the output of the laser into the loop 1210 as the pump beam.

One or more auxiliary feedback loops may be implemented in addition to the Brillouin opto-electronic feedback loop to form a multi-loop Brillouin OEO. An auxiliary feedback loop may be of any type, including an electrical feedback loop, an optical loop, a non-Brillouin opto-electronic loop, or another Brillouin opto-electronic loop. Each loop may have an open loop gain smaller than unity and is still capable of sustaining an oscillation as long as the total open loop gain of all loops is greater than unity.

The oscillator 101 in the system 100 of FIG. 1 can also be implemented by a coupled opto-electronic oscillator ("COEO"). Such a COEO directly couples a laser oscillation in an optical feedback loop to an electrical oscillation in an opto-electronic feedback loop. See, e.g., U.S. Pat. No. 5,929,430 to Yao and Maleki, which is incorporated by reference in its entirety. The laser oscillation and the electrical oscillation are correlated with each other so that both the modes and stability of one oscillation are coupled with those of the other oscillation. The optical feedback loop includes a gain medium to produce a loop gain greater than unity to effectuate the laser oscillation. This optical loop may be a Fabry-Perot resonator, a ring resonator, other resonator configurations. The open loop gain in the opto-electronic loop also exceeds the loss to sustain the electrical oscillation. The coupling between two feedback loops is achieved by controlling the loop gain of the optical loop by an electrical signal generated by the opto-electronic feedback loop. COEOs can achieve a single-mode RF oscillation without a RF bandpass filter or any additional opto-electronic feedback loops. A multi-mode laser can be used.

Figure 13:
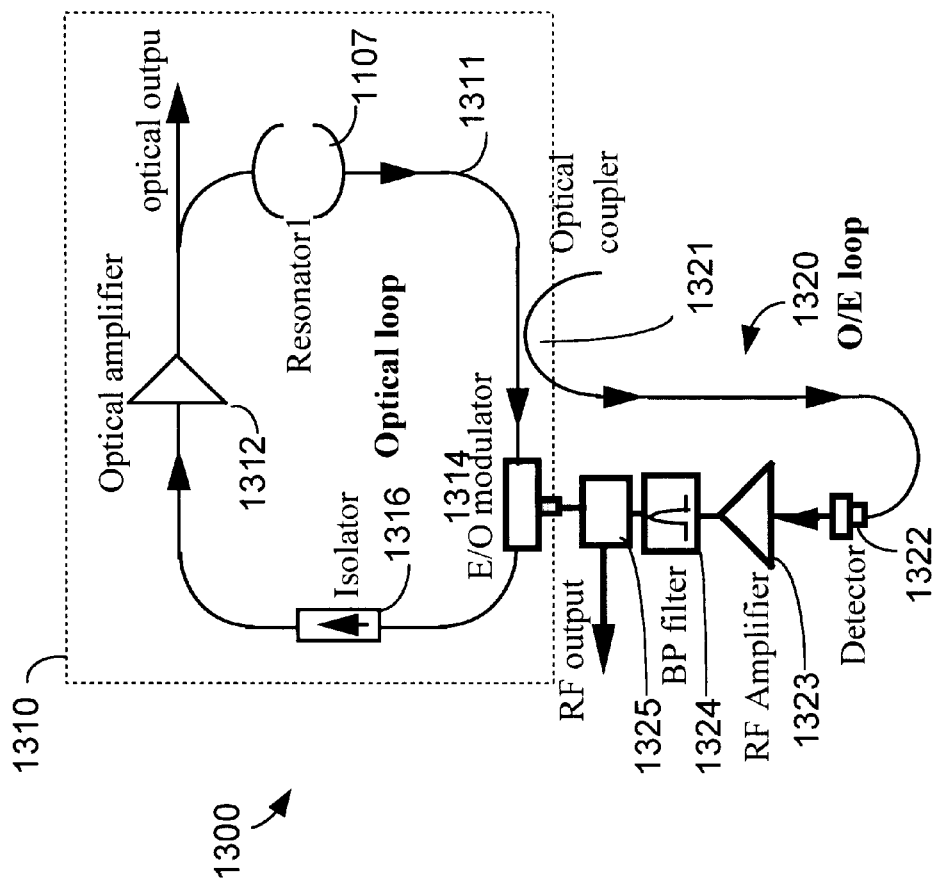
FIG. 13 shows one embodiment of a coupled opto-electronic oscillator that can be used as the oscillator in FIG. 1.

FIG. 13 shows one embodiment of a COEO having an optical feedback loop 1310 and an opto-electronic loop 1320. The optical loop 1310 is shown to be a ring laser that includes an optical amplifier 1312 and an EO modulator 1314. An optical isolator 1316 may be used to ensure the optical wave in the loop 1310 is unidirectional. The ring may be formed by optical fiber 1311 or other optical waveguides. The optical amplifier 1312 and the EO modulator 1314 in combination effectuate a laser gain medium whose gain can be controlled and modulated by the electrical control signal from the opto-electronic loop 1320. A semiconductor optical amplifier, for example, can be used to function as the combination of the amplifier 1312 and the modulator 1314.

An optical resonator 1107 may be placed in the optical loop 1310 so that the optical modes inside the optical loop 1310 are controlled by the modes of the resonator 1107, i.e., only the modes of the loop 1310 that overlap with the modes of the resonator 1107 can have enough gain to oscillate. Therefore, the optical frequencies of the laser are automatically aligned with the transmission peaks of the resonator 1107. In addition, the frequency control circuit 500 can also be used to lock the relative frequency difference between the resonator 1107 and the signal laser 1101.

The loop 1320 includes an optical coupler 1321, a photodetector 1323, an amplifier 1323, and a bandpass filter 1324. A coupler 1325 may also be added to produce a RF output.

The above devices and their variations can be made compact and integrated on a single semiconductor substrate if one or more optical resonators therein are implemented by micro resonators in whispering gallery modes. The resonators shown in FIGS. 4C and 4D show two examples.

Figure 14:
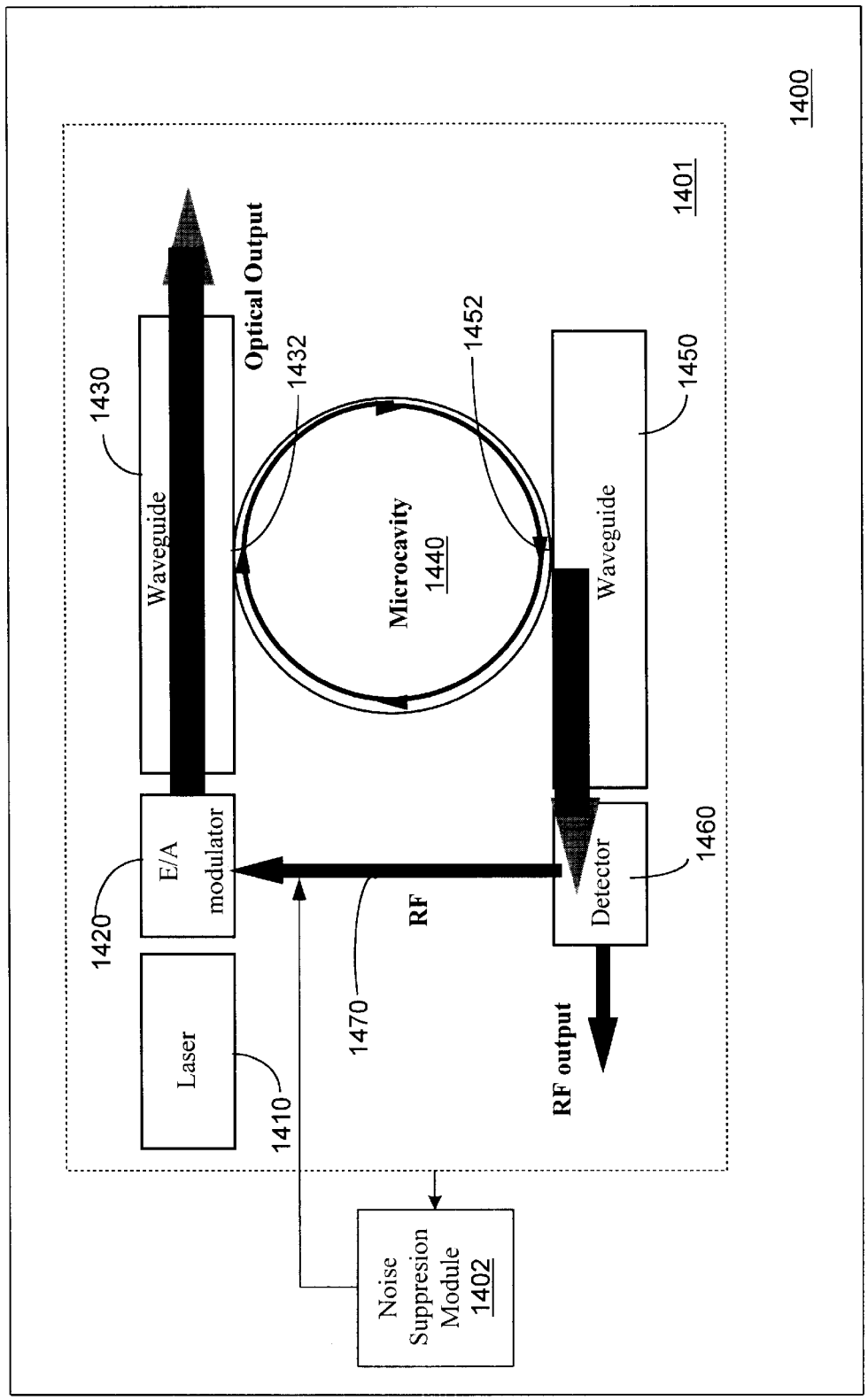
FIGS. 14 and 15 show two exemplary integrated opto-electronic oscillators with a noise suppression module.

FIG. 14 illustrates an embodiment of an integrated opto-electronic device having an OEO 1401 and a noise suppression module 1402 fabricated on a semiconductor substrate 1400. The OEO 1401 of this integrated device includes a semiconductor laser 1410, a semiconductor electro-absorption modulator 1420, a first waveguide 1430, a micro resonator 1440 in whispering gallery modes, a second waveguide 1450, and a photodetector 1460. An electrical link 1470, e.g., a conductive path, is also formed on the substrate 1400 to electrically couple the detector 1460 to the modulator 1420. The micro resonator 1440 can be a microsphere, a micro disk, or a ring and operates in the whispering-gallery modes. It is used as a high-Q energy storage element to achieve low phase noise and micro size. A RF filter may be disposed in the link 1470 to ensure a single-mode oscillation. In absence of such a filter, a frequency filtering effect can be achieved by narrow band impedance matching between the modulator 920 and the detector 1460.

Both waveguides 1430 and 1450 have coupling regions 1432 and 1452, respectively, to provide proper evanescent optical coupling at two different locations in the micro resonator 1440. The first waveguide 1430 has one end coupled to the modulator 1420 to receive the modulated optical output and another end to provide an optical output of the OEO 1401. The second waveguide 1450 couples the optical energy from the micro resonator 1440 and delivers the energy to the detector 1460.

The complete closed oscillating opto-electronic loop is formed by the modulator 1420, the first waveguide 1430, the micro resonator 1440, the second waveguide 1450, the detector 1460, and the electrical link 1470. The phase delay in the closed loop is set so that the feedback signal from the detector 1460 to the modulator 1420 is positive. In addition, the total open loop gain exceeds the total loss to sustain an opto-electronic oscillation.

The noise suppression module 1402, also integrated on the substrate 1400, can be configured in any one of the configurations shown in the examples described above. In one example, the noise suppression module 1402 can have its own micro resonator in the whispering gallery modes, e.g., in configurations shown in FIGS. 1, 8A, and 8B. In another example, the optical section of the noise suppression module 1402 can be coupled to the OEO 1401 so that the micro resonator 1440 is also used by the module 1402 to function as a frequency discriminator as exemplified by FIGS. 7 and 8C. The noise suppression module 1402 can use either an optical output or an electrical output to produce the noise control signal for controlling the modulator 1420.

The OEO 1401 can be configured to eliminate a signal amplifier in the link 1470 by matching the impedance between the electro-absorption modulator 1420 and the photodetector 1460 at a high impedance value. The desired matched impedance is a value so that the photovoltage transmitted to the modulator 1420, without amplification, is sufficiently high to properly drive the modulator 1420. In certain systems, for example, this matched impedance is at about 1 kilo ohm or several kilo ohms. The electrical link 1470 is used, without a signal amplifier, to directly connect the photodetector 1460 and the modulator 1420 to preserve their high impedance. Such a direct electrical link 1470 also ensures the maximum energy transfer between the two devices 1420 and 1460. For example, a pair of a detector and a modulator that are matched at 1000 ohm has a voltage gain of 20 times that of the same pair that are matched at 50 ohm.

One way to achieve the impedance matching is to make the photodetector 1460 structurally identical to the electro-absorption modulator 1420. However, the device 1460 is electrically biased in a way to operate as a photodetector. Hence, the photodetector 1460 and the modulator 1420 have a similar impedance, e.g., on the order of a few kilo ohms, and thus are essentially impedance matched. Taking typical values of 2 volts modulator switching voltage, 1 kilo ohm for the impedance of the modulator 1420 and photodetector 1460, the optical power required for the sustained RF oscillation is estimated at about 1.28 mW when the detector responsivity is 0.5 A/W. Such an optical power is easily attainable in semiconductor lasers. Therefore, under the impedance matching condition, a RF amplifier can be eliminated in the electrical link 1470.

Figure 15:
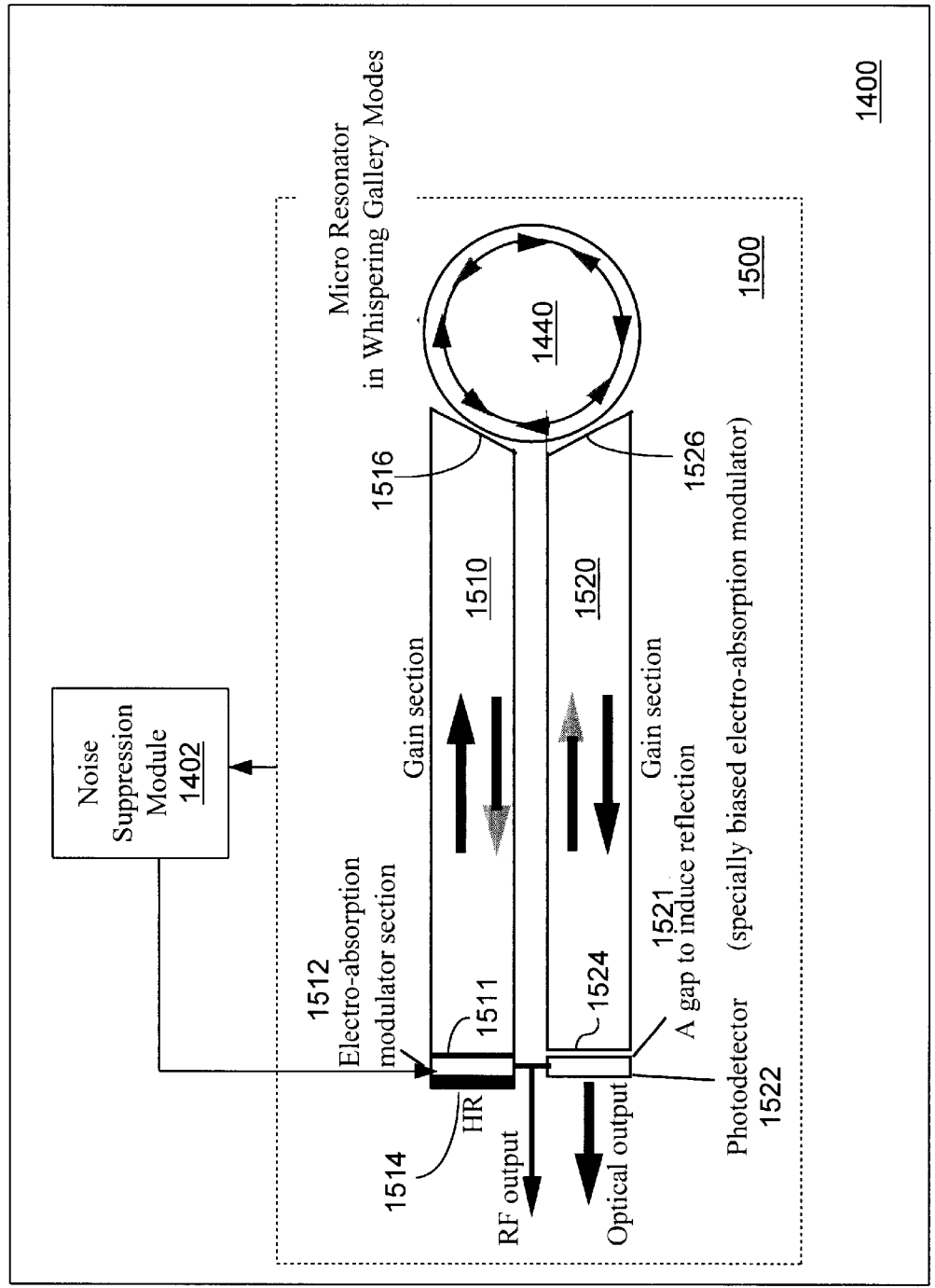

FIG. 15 shows an embodiment of a coupled OEO 1500 having the micro cavity 1440 in whispering gallery modes and a noise suppression module 1402 on a substrate 1400. Two waveguides 1510 and 1520 are coupled to the micro cavity 1440. The waveguides 1510 and 1520 have angled ends 1516 and 1526, respectively, to couple to the micro cavity 1440 by evanescent coupling. The other end of the waveguide 1510 includes an electrical insulator layer 1511, an electro-absorption modulator section 1512, and a high reflector 1514. This high reflector 1514 operates to induce pulse colliding in the modulator 1512 and thus enhance the mode-locking capability. The other end of the waveguide 1520 is a polished surface 1524 and is spaced from a photodetector 1522 by a gap 1521. The surface 1524 acts as a partial mirror to reflect a portion of light back into the waveguide 1520 and to transmit the remaining portion to the photodetector 1522 to produce an optical output and an electrical signal. An electrical link 1530 is coupled between the modulator 1512 and photodetector 1522 to produce an electrical output and to feed the signal and to feed the electrical signal to control the modulator 1512.

Hence, two coupled oscillating feedback loops are formed in the device. An optical oscillating loop is in the form of a Fabry-Perot resonator configuration, which is formed between the high reflector 1514 and the surface 1524 of the waveguide 1520 through the modulator 1512, the waveguide 1510, the micro cavity 1502, and the waveguide 1520. The gap 1521, the detector 1522, and the electrical link 1530 forms another opto-electronic oscillating loop that is coupled to the optical loop.

The waveguides 1510 and 1520 are active and doped to also function as the gain medium so that the optical loop operates as a laser when activated by a driving current. This current can be injected from proper electrical contacts coupled to an electrical source. The gain of the laser is modulated electrically by the modulator 1512 in response to the electrical signal from the photodetector 1522.

Figure 16A:
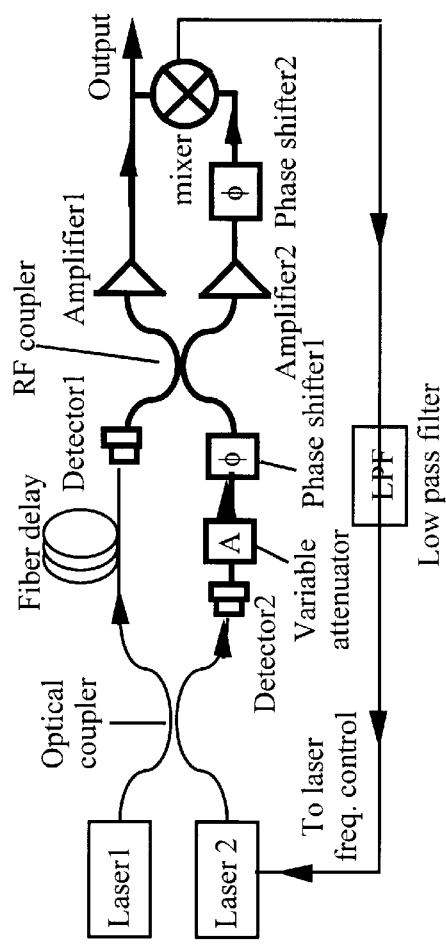
FIGS. 16A and 16B show exemplary laser heterodyning devices based on the carrier suppression.
Figure 16B:
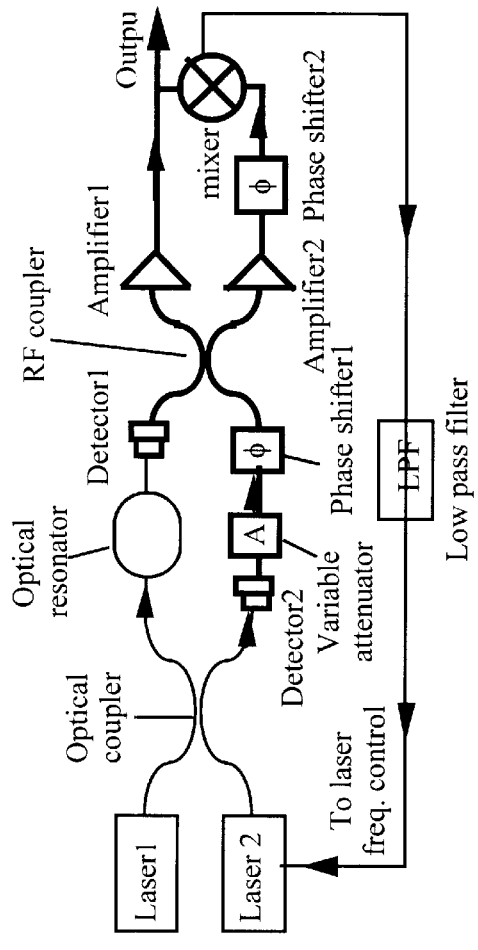

In addition to the above applications, the carrier suppression technique can also be used to reduce the RF signal generated with laser heterodyning devices. FIGS. 16A and 16B show two exemplary configurations using a fiber delay loop and an optical resonator, respectively.

In both systems, light beams from laser 1 and laser 2 are combined with an optical coupler. The signal from one output port of the coupler is received immediately with a photodetector, detector 2, and the signal from the other output port is delayed by a long fiber delay line or an optical resonator before reaching another photodetector, detector 1. The two laser beams inside each of the photodetectors 1 and 2 will beat with each other and produce a RF signal with a frequency equals to the frequency difference of the two lasers.

The output RF signals from the two detectors 1 and 2 are fed into the RF coupler interferometer to interfere with each other. Similar to the cases described before, the phase and the amplitude of the RF signal in one of the interferometer arm is carefully adjusted so that the power at one of the output port is minimum ("dark") and the output power at the other output port is maximum ("bright"). The "bright" signal, whose noise to signal ratio was not affected by the RF bridge, is then further amplified before entering the LO port of a mixer. On the other hand, the "dark" signal, whose noise to signal ratio is greatly enhanced by the carrier suppression, is greatly amplified before entering the RF port of the mixer to be compared with the "bright" signal at the LO.

The phase shifter in the RF (or LO) path is adjusted so that IF output is either minimum or maximum (the relative phase between the RF and LO is either 0 or $\pi$ for detecting amplitude noise). The enhanced error signal from the IF port of the mixer is then fed back via a loop filter to laser 2 to control the laser frequency. Consequently, the relative frequency between the two lasers 1 and 2 and the generated RF signal are stabilized.

The systems shown in FIGS. 16A and 16B may be constructed without the two lasers 1 and 2 but have two input ports to receive laser beams and an output port to output the control signal that controls one or both lasers. Hence, two lasers can be coupled to such a system to stabilize their relative frequency and to produce a stable RF signal based on the beat between the lasers. In addition, such a system can also be integrated on a semiconductor substrate.

Although only a few embodiments are described, various modifications and enhancements may be made without departing from the following claims.

What is claimed is:

1. An opto-electronic device, comprising:
   an oscillator to produce an oscillation signal at a carrier frequency, said oscillator responsive to a control signal to change a characteristic of said oscillation signal; and
   a noise suppression module coupled to said oscillator to produce said control signal in response to said oscillation signal, said noise suppression module including:
   an opto-electronic unit having an optical delay element and a photodetector to produce a first electrical signal indicative of said oscillation signal, and
   an electrical interferometer coupled to said opto-electronic unit to interfere said first electrical signal with a second electrical signal indicative of said oscillation signal to produce a first output signal representing a destructive interference and a second output signal representing a constructive interference;
   wherein said noise suppression module generates said control signal based on said first output signal from said electrical interferometer.

2. A device as in claim 1, wherein said oscillator produces an optical output that is modulated to carry said oscillation signal at said carrier frequency.

3. A device as in claim 2, wherein said noise suppression module includes an optical coupler to couple a portion of said optical output to said optical delay element.

4. A device as in claim 1, wherein said oscillation signal is an electrical signal, and said noise suppression module includes an electrical coupler to couple a portion of said oscillation signal to said opto-electronic unit, and
   wherein said opto-electronic unit includes a laser transmitter to produce an optical output in response to said portion of said oscillation signal.

5. A device as in claim 4, wherein said laser transmitter includes a laser and an electro-optical modulator.

6. A device as in claim 1, wherein said noise suppression module includes a signal coupler that coupled a portion of said oscillation signal from said oscillator to produce said second electrical signal.

7. A device as in claim 6, wherein said signal coupler is an optical coupler.

8. A device as in claim 6, wherein said signal coupler is an electrical signal coupler.

9. A device as in claim 1, wherein said noise suppression module includes a phase shifting device coupled to control a phase difference between said first and second electrical signals.

10. A device as in claim 1, wherein said noise suppression module includes a device coupled to control a relative strength between said first and second electrical signals.

11. A device as in claim 1, wherein said electrical interferometer includes a RF coupler.

12. A device as in claim 1, wherein said noise suppression module includes a phase shifting device coupled to control a phase difference between said first and second output signals from said electrical interferometer.

13. A device as in claim 12, wherein said phase difference is $N\pi$, where N is an integer.

14. A device as in claim 1, wherein said noise suppression module includes an electrical signal mixer coupled to receive at least said first output signal from said electrical interferometer.

15. A device as in claim 14, wherein said noise suppression module includes a signal amplifier coupled between said electrical interferometer and said signal mixer to amplify said first output signal.

16. A device as in claim 13, wherein said noise suppression module includes a low pass filter to control a bandwidth of said control signal.

17. A device as in claim 1, wherein said optical delay element includes a segment of optical fiber.

18. A device as in claim 1, wherein said optical delay element includes an optical resonator.

19. A device as in claim 18, wherein said optical resonator is a Fabry-Perot resonator.

20. A device as in claim 19, wherein said resonator encloses a segment of optical fiber.

21. A device as in claim 18, wherein said optical resonator is a ring resonator.

22. A device as in claim 21, wherein said optical resonator encloses a segment of optical fiber.

23. A device as in claim 18, wherein said optical resonator includes a resonator in whispering gallery modes.

24. A device as in claim 1, wherein said oscillator includes an optical signal path to support an optical wave which is modulated at said carrier frequency.

25. A device as in claim 24, wherein said optical signal path is coupled to said opto-electronic unit in said noise suppression module.

26. A device as in claim 25, wherein a portion of said optical signal path includes said optical delay element.

27. A device as in claim 23, wherein said optical path includes an optical medium of a type that produces a Brillouin scattering signal.

28. A device as in claim 1, further comprising a substrate on which said oscillator and said noise suppression are integrated.

29. A device as in claim 1, wherein said oscillator includes a dielectric resonator to produce an oscillation at a RF or microwave frequency.

30. A device as in claim 1, wherein said oscillator includes an acoustic resonator to produce an oscillation at a RF or microwave frequency.

31. A device as in claim 1, wherein said oscillator includes a microwave cavity.

32. A device as in claim 1, wherein said optical delay element includes an optical resonator to receive an optical signal indicative of said oscillation signal, wherein a center frequency of said optical signal is within a transmission peak of said optical resonator.

33. A device as in claim 1, wherein said carrier frequency is a multiple of a free spectral range of said optical resonator.

34. An opto-electronic device, comprising:
an optical modulator, having an electrical input port to accept an electrical modulation signal and an optical input port to receive an input optical signal at an optical frequency, to generate an output optical signal which is modulated to carry an oscillation signal at an oscillation frequency related to said electrical modulation signal; and
an opto-electronic unit, having an optical delay element coupled to receive at least a portion of said output optical signal and an electrical section coupled to said electrical input port to produce said electrical modulation signal, said electrical section including:
a photodetector to receive an optical transmission from said optical delay element to produce a first electrical signal;
an electrical interferometer coupled to receive said first electrical signal and a second electrical signal indicative of said oscillation signal to cause interference therebetween, to produce a first output signal representing a destructive interference and a second output signal representing a constructive interference;
a signal mixer coupled to receive and mix said first output signal from said electrical interferometer and a local oscillator electrical signal indicative of said oscillating signal to produce a first control signal; and
a phase shifting device coupled to control a phase of said second output signal from said electrical interferometer in response to said first control signal to produce said electrical modulation signal.

35. A device as in claim 34, wherein said electrical section includes an amplifier in a signal path between said phase shifting device and said interferometer.

36. A device as in claim 34, wherein said electrical section includes a band pass filter in a signal path between said phase shifting device and said interferometer.

37. A device as in claim 34, wherein said electrical section includes a low pass filter coupled in a signal path between said phase shifting device and said signal mixer to filter said first control signal.

38. A device as in claim 34, wherein said electrical section includes a phase shifting device coupled to control a phase difference between said first and second electrical signals.

39. A device as in claim 34, wherein said electrical section includes a device coupled to control a relative strength between said first and second electrical signals.

40. A device as in claim 34, wherein said electrical interferometer includes a RE coupler.

41. A device as in claim 34, wherein said electrical section includes a phase shifting device coupled to control a phase difference between said first and second output signals from said electrical interferometer.

42. A device as in claim 41, wherein said phase difference is $N\pi$, where N is an integer.

43. A device as in claim 34, wherein said optical delay element includes a segment of optical fiber.

44. A device as in claim 34, wherein said optical delay element includes an optical resonator.

45. A device as in claim 44, wherein said optical resonator is a Fabry-Perot resonator.

46. A device as in claim 45, wherein said resonator encloses a segment of optical fiber.

47. A device as in claim 44, wherein said optical resonator is a ring resonator.

48. A device as in claim 47, wherein said optical resonator encloses a segment of optical fiber.

49. A device as in claim 44, wherein said optical resonator includes a resonator in whispering gallery modes.

50. A method for controlling an electrical controlled oscillator that produces an oscillation signal at a carrier frequency, comprising:

producing an optical signal that is modulated to carry the oscillation signal;

transmitting said optical signal through an optical delay element to produce a delayed optical transmission signal;

converting said optical transmission signal into a first electrical signal indicative of the oscillation signal, producing a second electrical signal indicative of the oscillation signal;

interfering said first and said second electrical signals in an electrical interferometer to produce a first output signal representing a destructive interference and a second output signal representing a constructive interference; and applying said second output signal to control the oscillator.

51. A method as in claim 50, further comprising controlling a phase difference between said first and second electrical signals.

52. A method as in claim 50, further comprising controlling a relative strength between said first and second electrical signals.

53. A method as in claim 50, further comprising controlling a phase difference between said first and second output signals from said electrical interferometer.

54. A method as in claim 53, wherein said phase difference is $N\pi$, where N is an integer.

55. A method as in claim 53, further comprising using a signal mixer to mix said first and second output signals to produce an output that is substantially free of a contribution from said second output signal.

56. An opto-electronic device for controlling an oscillator which produces an oscillation signal at a carrier frequency, comprising:

an input port to receive an oscillation signal from an oscillator;

an opto-electronic unit having an optical delay element and a photodetector to produce a first electrical signal indicative of the oscillation signal;

an electrical interferometer coupled to said opto-electronic unit to interfere said first electrical signal with a second electrical signal indicative of the oscillation signal to produce a first output signal representing a destructive interference and a second output signal representing a constructive interference; and an output port to generate a control signal to the oscillator based on said first output signal from said electrical interferometer.

57. A device as in claim 56, further including a phase shifting device coupled to control a phase difference between said first and second electrical signals.

58. A device as in claim 56, further including a device coupled to control a relative strength between said first and second electrical signals.

59. A device as in claim 56, further including a phase shifting device coupled to control a phase difference between said first and second output signals from said electrical interferometer.

60. A device as in claim 59, wherein said phase difference is $N\pi$, where N is an integer.

61. A device as in claim 56, further including a signal mixer coupled to receive said first output signal from said electrical interferometer and another electrical signal indicative of the oscillation signal to produce said control signal at said output port.

62. An opto-electronic device, comprising:

an optical coupler having first and second input ports to receive input beams from two different lasers and first and second output ports;

an optical delay element coupled to said first output port of said optical coupler;

a first photodetector coupled to receive an output from said optical delay element to produce a first electrical signal;

a second photodetector coupled to receive an output from said second output port of said optical coupler to produce a second electrical signal;

an electrical interferometer having a first input to receive said first electrical signal and a second input to receive said second electrical signal, said electrical interferometer causing interference between said first and said second electrical signals to produce a first output signal representing a destructive interference and a second output signal representing a constructive interference;

a signal mixer to mix said first and second output signals to produce a control signal based on said first output signal; and an output port to output said control signal.

63. A device as in claim 62, further including a phase shifting device coupled to control a phase difference between said first and second output signals from said electrical interferometer.

64. A device as in claim 63, wherein said phase difference is $N\pi$, where N is an integer.

* * * * *

UNITED STATES PATENT AND TRADEMARK OFFICE
CERTIFICATE OF CORRECTION

PATENT NO. : 6,580,532 B1
APPLICATION NO. : 09/493642
DATED : June 17, 2003
INVENTOR(S) : Yao et al.

It is certified that error appears in the above-identified patent and that said Letters Patent is hereby corrected as shown below:

Column 3, Line 53 replace "carrier signal [104]" with "carrier signal 107".

Column 3, Line 54 replace "Those two carrier signals," with "Those two carrier signals 105 and 107,".

Column 5, Line 8 replace "and the remaining carrier signal.[.]" with "and the remaining carrier signal.".

Column 5, Line 16 replace "~~facilitates~~ extraction" with "facilitate extraction".

Column 5, Line 38 replace "The RF mixer [142]" with "The RF mixer 144".

Column 7, Line 39 replace "techniques ~~depend~~ on" with "techniques depends on".

Column 14, Line 1 replace "whose noise to signal ratio [was]" with "whose noise to signal ratio is".

Column 17, Line 25 replace "applying said second output signal" with "applying said first and second output signal".

Signed and Sealed this

Fifth Day of May, 2009

JOHN DOLL
*Acting Director of the United States Patent and Trademark Office*